United States Patent
Yoon et al.

(10) Patent No.: US 11,380,552 B2
(45) Date of Patent: Jul. 5, 2022

(54) METHOD OF MANUFACTURING INTEGRATED CIRCUIT DEVICE

(71) Applicant: Samsung Electronics Co., Ltd., Suwon-si (KR)

(72) Inventors: Hyunchul Yoon, Seongnam-si (KR); Mincheol Kwak, Hwaseong-si (KR); Joonghee Kim, Anyang-si (KR); Jihee Kim, Yongin-si (KR); Yeongshin Park, Seoul (KR); Jungheun Hwang, Daejeon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/858,591

(22) Filed: Apr. 25, 2020

(65) Prior Publication Data

US 2021/0098260 A1    Apr. 1, 2021

(30) Foreign Application Priority Data

Oct. 1, 2019    (KR) .......................... 10-2019-0121726

(51) Int. Cl.
*H01L 21/308*    (2006.01)
*H01L 27/108*    (2006.01)

(52) U.S. Cl.
CPC ...... *H01L 21/3081* (2013.01); *H01L 21/3086* (2013.01); *H01L 27/10894* (2013.01); *H01L 27/10897* (2013.01)

(58) Field of Classification Search
CPC .......................... H01L 21/3081; H01L 21/3086
See application file for complete search history.

(56) References Cited

U.S. PATENT DOCUMENTS

| 6,013,399 | A  | 1/2000 | Nguyen |
| 7,081,407 | B2 | 7/2006 | Annapragada et al. |
| 8,222,151 | B2 | 7/2012 | Liang et al. |
| 8,936,948 | B2 | 1/2015 | Fujita |
| 8,975,178 | B2 | 3/2015 | Kikutani et al. |

(Continued)

FOREIGN PATENT DOCUMENTS

| CN | 102881648 A | 1/2013 |
| CN | 108538712 A * | 9/2018 |

(Continued)

OTHER PUBLICATIONS

KR 10-2007-0090622 A English machine translation, Kim et al "Method of manufacturing semiconductor device" Sep. 6, 2007. (Year: 2007).*

*Primary Examiner* — Anita K Alanko
(74) *Attorney, Agent, or Firm* — Muir Patent Law, PLLC

(57) ABSTRACT

In order to manufacture an integrated circuit device, a feature layer is formed on a substrate in a first area for forming a plurality of chips and in a second area surrounding the first area. The feature layer has a step difference in the second area. On the feature layer, a hard mask structure including a plurality of hard mask layers stacked on each other is formed. In the first area and the second area, a protective layer covering the hard mask structure is formed. On the protective layer, a photoresist layer is formed. A photoresist pattern is formed by exposing and developing the photoresist layer in the first area by using the step difference in the second area as an alignment key.

18 Claims, 34 Drawing Sheets

(56) References Cited

U.S. PATENT DOCUMENTS

| | | | |
|---|---|---|---|
| 9,177,818 B2 | 11/2015 | Hieno et al. | |
| 9,679,804 B1 | 6/2017 | Chen et al. | |
| 9,941,125 B2* | 4/2018 | Yang | H01L 21/32134 |
| 2008/0220375 A1* | 9/2008 | Kim | G03F 7/40 |
| | | | 430/315 |
| 2014/0239462 A1* | 8/2014 | Shamma | G03F 7/11 |
| | | | 257/637 |
| 2015/0126042 A1* | 5/2015 | Pasquale | C23C 16/401 |
| | | | 438/761 |
| 2017/0148643 A1* | 5/2017 | Ham | H01L 21/0337 |
| 2020/0350257 A1* | 11/2020 | Yang | H01L 21/56 |

FOREIGN PATENT DOCUMENTS

| | | |
|---|---|---|
| KR | 1020070090622 A | 9/2007 |
| KR | 1020100119447 A | 11/2010 |
| KR | 100997789 B1 | 12/2010 |

* cited by examiner

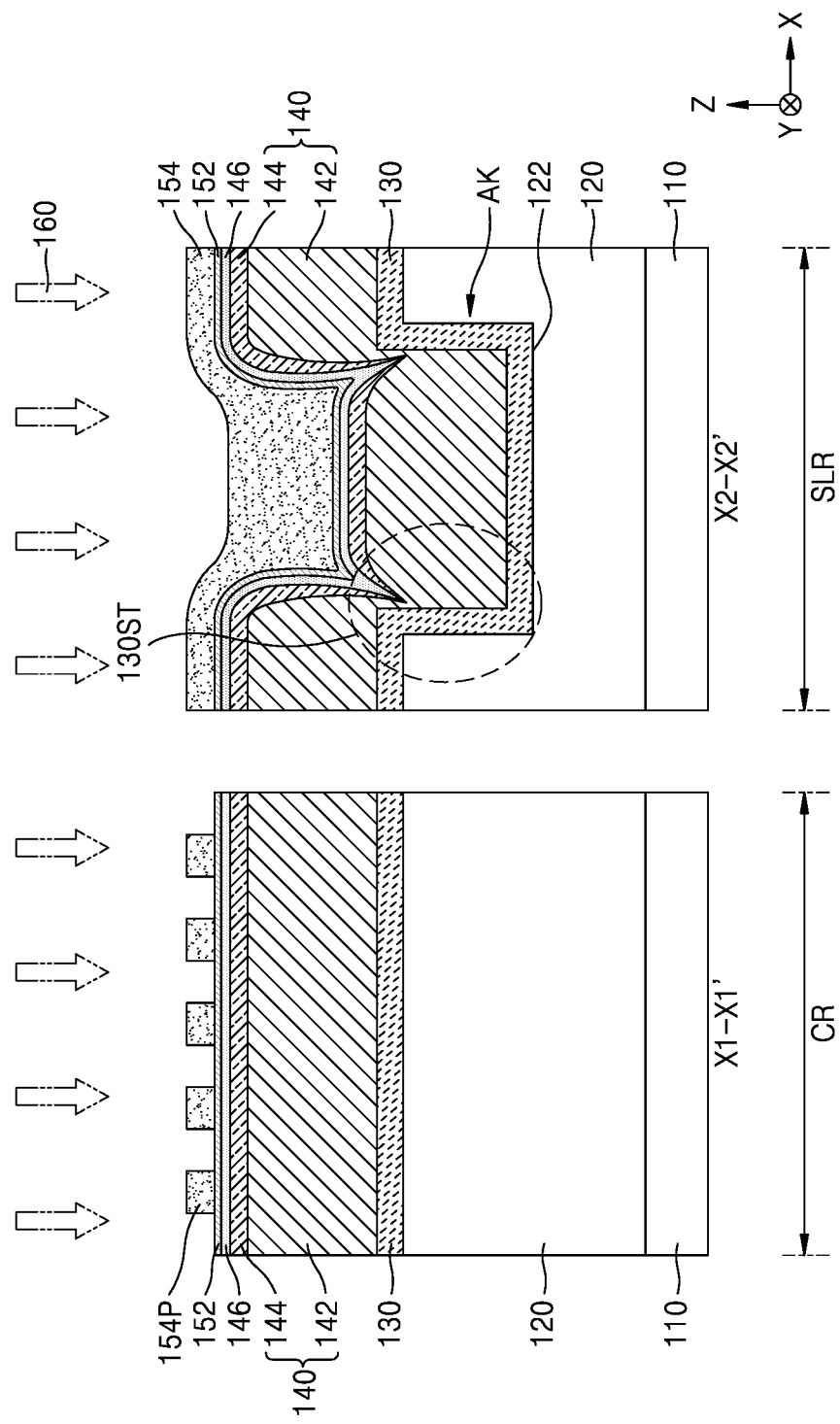

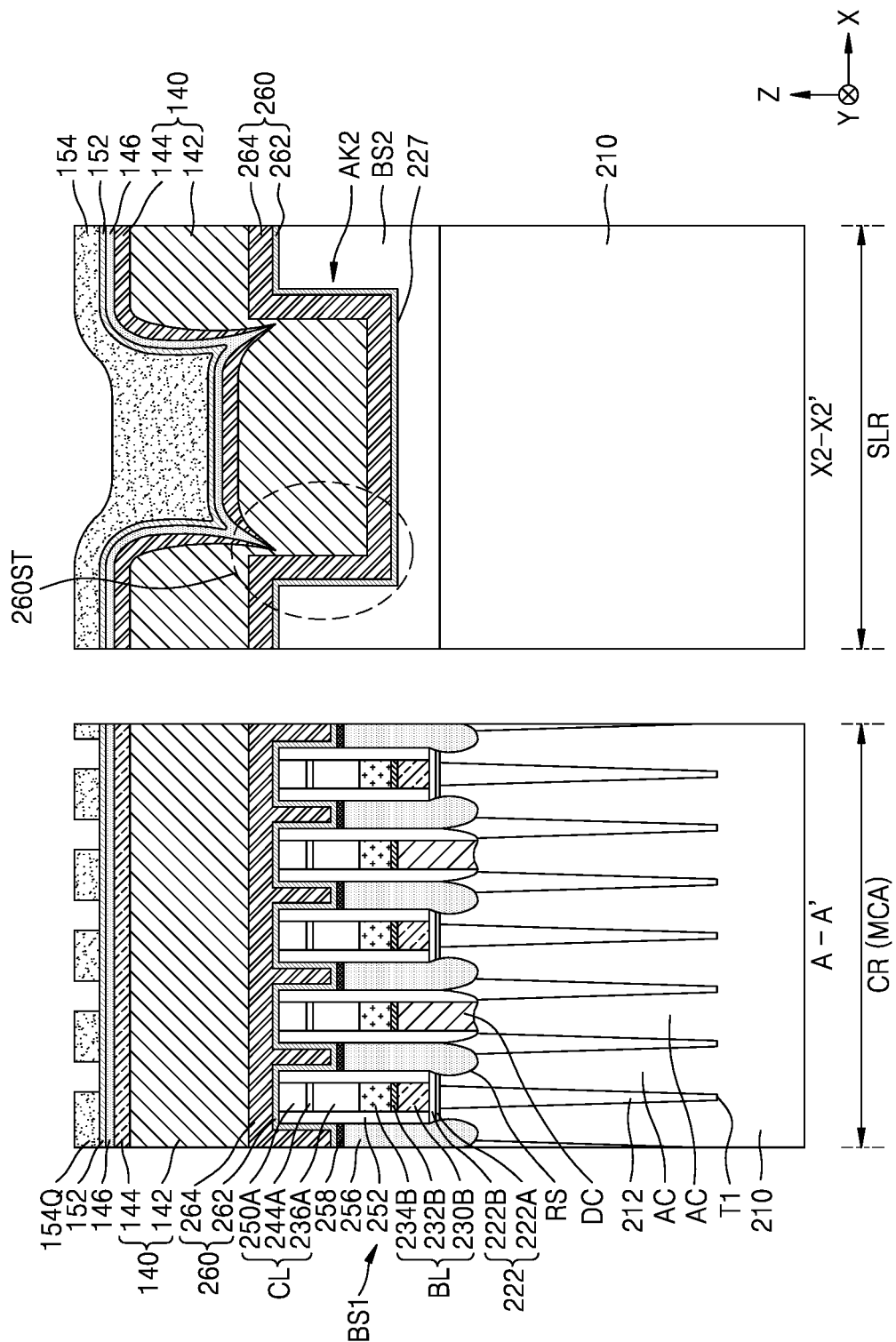

METHOD OF MANUFACTURING INTEGRATED CIRCUIT DEVICE

CROSS-REFERENCE TO RELATED APPLICATION

This application claims the benefit of Korean Patent Application No. 10-2019-0121726, filed on Oct. 1, 2019, in the Korean Intellectual Property Office, the disclosure of which is incorporated herein in its entirety by reference.

BACKGROUND

The inventive concept relates to a method of manufacturing an integrated circuit device, and more particularly, to a method of manufacturing an integrated circuit device capable of reducing process defects caused by rework in a photolithography process for manufacturing processes of the integrated circuit device.

Recently, as down-scaling of an integrated circuit device is rapidly proceeding, a feature size of the integrated circuit device is refined and a line width of each of patterns that form the integrated circuit device is gradually reduced. Therefore, when patterns having various shapes, sizes, and densities used for the integrated circuit device are simultaneously formed, process difficulty increases. In particular, when a rework process for removing a photoresist pattern and forming a new photoresist pattern is performed since defects occur in the photoresist pattern obtained after performing a photolithography process for manufacturing the integrated circuit device, it is necessary to develop a rework process in which lower structures, an etched layer, or hard mask layers left on a substrate are not damaged by a rework atmosphere and the rework process may be stably performed.

SUMMARY

The inventive concept provides a method of manufacturing an integrated circuit device capable of increasing the reliability of the integrated circuit device to be formed by stably performing a rework process without lower structures, an etched layer, or hard masks that are left on a substrate being damaged by a rework atmosphere although the rework process for removing a photoresist pattern and forming a new photoresist pattern is performed since defects occur in the photoresist pattern obtained after performing a photolithography process for manufacturing the integrated circuit device.

According to an aspect of the inventive concept, there is provided a method of manufacturing an integrated circuit device. In the method, a feature layer is formed on a substrate in a first area for forming a plurality of chips and in a second area surrounding the first area, the feature layer having a flat upper surface in the first area and a step difference in the second area. In the first and second areas, on the feature layer, a hard mask structure including a plurality of hard mask layers is formed. In the first and second areas, a protective layer covering the hard mask structure is formed so that the hard mask structure is not exposed. In the first and second areas, a photoresist layer is formed on the protective layer. By using the step difference in the second area as an alignment key, in the first area, a photoresist pattern is formed by exposing and developing the photoresist layer. In the first area, by using the photoresist pattern as an etching mask, the protective layer and the hard mask structure are etched.

According to an aspect of the inventive concept, there is provided a method of manufacturing an integrated circuit device. In the method, on a substrate, a first lower structure covering the substrate in a cell array region and a second lower structure covering the substrate in a scribe lane region are formed. A conductive layer covering the first lower structure and the second lower structure and having a step difference in the scribe lane region is formed. A hard mask structure including a plurality of hard mask layers is formed on the conductive layer in the cell array region and the scribe lane region. A protective layer covering the hard mask structure is formed so that the hard mask structure is not exposed in the cell array region and the scribe lane region. A photoresist layer is formed on the protective layer in the cell array region and the scribe lane region. A photoresist pattern is formed by exposing and developing the photoresist layer in the cell array region by using the step difference in the scribe lane region as an alignment key. The protective layer and the hard mask structure are etched by using the photoresist pattern in the cell array region as an etching mask.

According to an aspect of the inventive concept, there is provided a method of manufacturing an integrated circuit device. In the method, a first lower structure including a plurality of bit lines each including a metal layer is formed on a substrate in a cell array region and a second lower structure including a trench in an upper surface of the second lower structure is formed on the substrate in a scribe lane region. A conductive layer covering the first lower structure and the second lower structure and having a step difference around the trench in the scribe lane region is formed. A hard mask structure including an amorphous silicon layer is formed on the conductive layer in the cell array region and the scribe lane region. A protective layer covering the hard mask structure is formed so that the amorphous silicon layer is not exposed in the cell array region and the scribe lane region. A photoresist layer is formed on the protective layer in the cell array region. A photoresist pattern is formed by exposing and developing the photoresist layer in the cell array region by using the step difference in the scribe lane region as an alignment key. The photoresist pattern is examined. When it is determined that the photoresist pattern is defective in the examining of the photoresist pattern, the photoresist pattern is removed at an oxygen containing atmosphere in a state in which the protective layer covers the hard mask structure and the forming of the photoresist layer and the forming of the photoresist pattern are performed again. A plurality of landing pads formed of a plurality of island patterns spaced apart from each other and regularly arranged are formed from the conductive layer by transcribing a shape of the photoresist pattern onto the conductive layer in the cell array region.

BRIEF DESCRIPTION OF THE DRAWINGS

Embodiments of the inventive concept will be more clearly understood from the following detailed description taken in conjunction with the accompanying drawings in which:

In FIG. 2A, (a) is a perspective view illustrating parts of the plurality of chip regions and (b) is a plan view illustrating a plane arrangement of the plurality of island patterns illustrated in (a);

FIGS. 4A to 4C are cross-sectional views illustrating processes of a method of manufacturing an integrated circuit device in order according to other example embodiments of the inventive concept;

FIGS. 9A to 9E are cross-sectional views illustrating processes of a method of manufacturing an integrated circuit device in order according to example embodiments of the inventive concept.

DETAILED DESCRIPTION OF THE EMBODIMENTS

Figure 1:
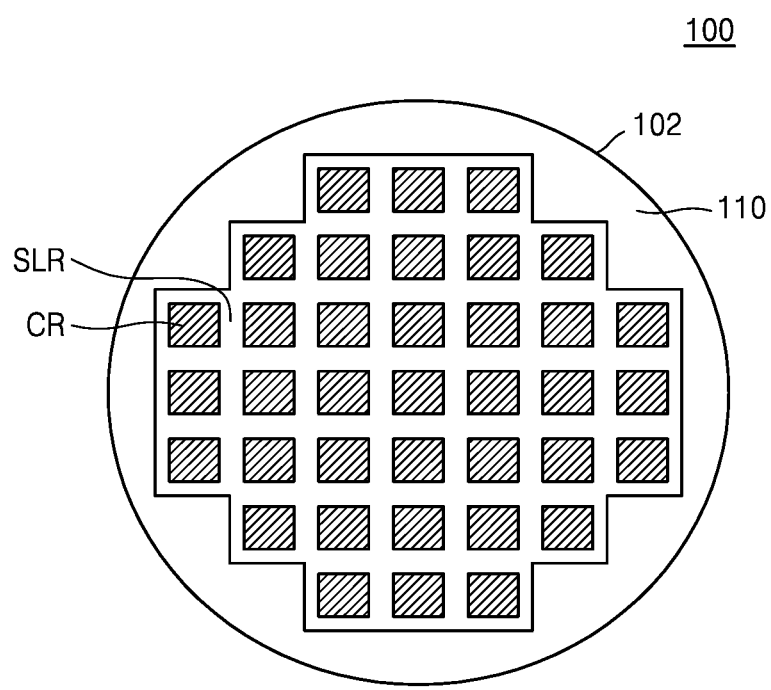
FIG. 1 is a schematic plan view illustrating an exemplary configuration of an integrated circuit device that may be obtained by a method of manufacturing an integrated circuit device according to example embodiments of the inventive concept.

Hereinafter, various example embodiments of the inventive concept will be described in detail with reference to the accompanying drawings. Like reference numerals refer to like elements throughout.

FIG. 1 is a schematic plan view illustrating an integrated circuit device 100 that may be obtained by a method of manufacturing an integrated circuit device according to example embodiments of the inventive concept.

Referring to FIG. 1, the integrated circuit device 100 includes a substrate 110 having a plurality of chip regions CR and a scribe lane region SLR that surrounds the plurality of chip regions CR. On the substrate 110, the plurality of chip regions CR may be arranged in a matrix. The scribe lane region SLR may include a cutting area for individualizing the plurality of chip regions CR.

The plurality of chip regions CR may be high density areas each having high pattern density, and the scribe lane region SLR may be a low density area having low pattern density. Each of the plurality of chip regions CR may include a cell array region of a semiconductor memory device and a peripheral circuit area and a core area including circuits that may be electrically connected to cell arrays included in the cell array region. In exemplary embodiments, in the cell array region, a volatile memory cell array such as dynamic random access memory (DRAM) or a non-volatile memory cell array such as flash memory may be formed. In the cell array region, a plurality of patterns each having a small width may be spaced apart from each other, may be regularly arranged in an X direction or a Y direction perpendicular to the X direction, and may be repeatedly formed with a small pitch.

Referring to FIG. 1, the integrated circuit device 100 may be a semiconductor wafer 102. The semiconductor wafer 102 may include the substrate 110 having the plurality of chip regions CR and the scribe lane region SLR. Each of the plurality of chip regions CR may have a corresponding semiconductor device formed therein (which may form a corresponding semiconductor chip when separated from the semiconductor wafer 102). A plurality of semiconductor devices may be two-dimensionally arranged with respect to a top down view of the semiconductor wafer 102. The integrated circuit device 100 may thus comprise the plurality of semiconductor devices. The plurality of semiconductor devices may include integrated circuits formed by integrated circuit device manufacturing processes. The plurality of semiconductor devices may be integrally formed together with the scribe lane region SLR. The plurality of semiconductor devices of the integrated circuit device 100 may be semiconductor memory devices, such as integrated circuit device 200 described herein.

The scribe lane region SLR may be formed of a plurality of linear scribe lines extending in perpendicular directions to form a grid (where chip regions CR form grid elements of the grid). Each of the chip regions CR may be surrounded by the scribe lane region SLR. The scribe lines of the scribe lane region SLR may denote where the semiconductor wafer 102 (after formation of the semiconductor devices in the chip regions CR) may be cut to separate the resulting semiconductor devices from each other (to form semiconductor chips corresponding to the semiconductor devices formed in the chip regions CR). In some examples, the scribe lane region SLR may have no circuitry (e.g., no transistors) formed that are necessary for the operation of the resulting semiconductor devices formed in the chip regions CR. For example, metal patterns formed in the scribe lane regions SLR may be electrically floating and/or be unconnected to the semiconductor devices formed in the chip regions CR.

Figure 2A:
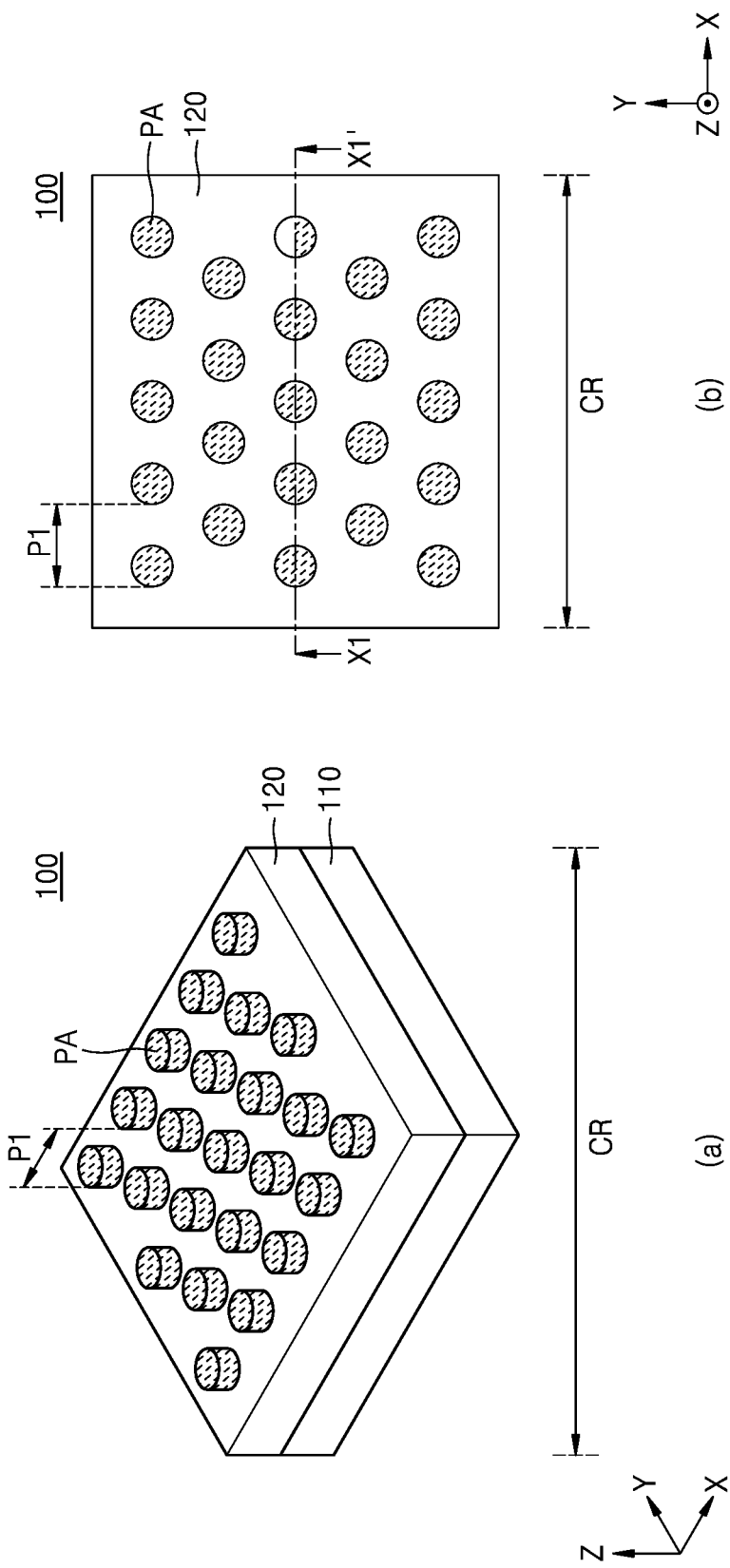
FIG. 2A is a view illustrating a plurality of island patterns that may be implemented in a plurality of chip regions of an integrated circuit device that may be obtained by a method of manufacturing an integrated circuit device according to example embodiments of the inventive concept.

FIG. 2A is a view illustrating a plurality of island patterns PA that may be implemented in a chip region CR of the integrated circuit device 100 of FIG. 1 according to example embodiments. In FIG. 2A, (a) is a perspective view illustrating parts of the chip region CR and (b) is a plan view illustrating a plane arrangement of the plurality of island patterns PA illustrated in (a).

Referring to FIG. 2A, in the integrated circuit device 100, in the chip region CR, a lower structure 120 formed on the substrate 110 and a plurality of island patterns PA formed on the lower structure 120 may be included.

The substrate 110 may include semiconductor elements such as silicon (Si) or germanium (Ge) or a compound semiconductor such as SiC, GaAs, InAs, or InP. The lower structure 120 may include an insulating layer, a conductive layer, or a combination of the above layers. For example, the lower structure 120 may include structures including at least one conductive area. The conductive area may be formed of a doped structure, a doped semiconductor layer, a metal layer, or a combination of the above structure and layers. The lower structure 120 may include conductive areas, for example, a wiring layer, a contact plug, and a transistor and insulating layers insulating the wiring layer, the contact plug, and the transistor from each other.

The plurality of island patterns PA may be repeatedly arranged on the lower structure 120 in a horizontal direction, for example, an X direction with a first pitch P1 in the chip region CR. Each of the plurality of island patterns PA may have a cylindrical cross-section.

Each of the plurality of island patterns PA may include an insulating pattern, a conductive pattern, or a combination of the above patterns. In exemplary embodiments, each of the plurality of island patterns PA may be formed of a doped semiconductor, metal, a conductive metal nitride, or a combination of the above materials. Each of the plurality of island patterns PA may have a single layer structure or a multilayer structure.

In FIG. 2A, the plurality of island patterns PA are illustrated as being spaced apart from each other and regularly arranged in the X direction or the Y direction to have a honeycomb structure on a plane. However, the inventive concept is not limited thereto. For example, the plurality of island patterns PA may be arranged in a matrix on a plane.

Figure 2B:
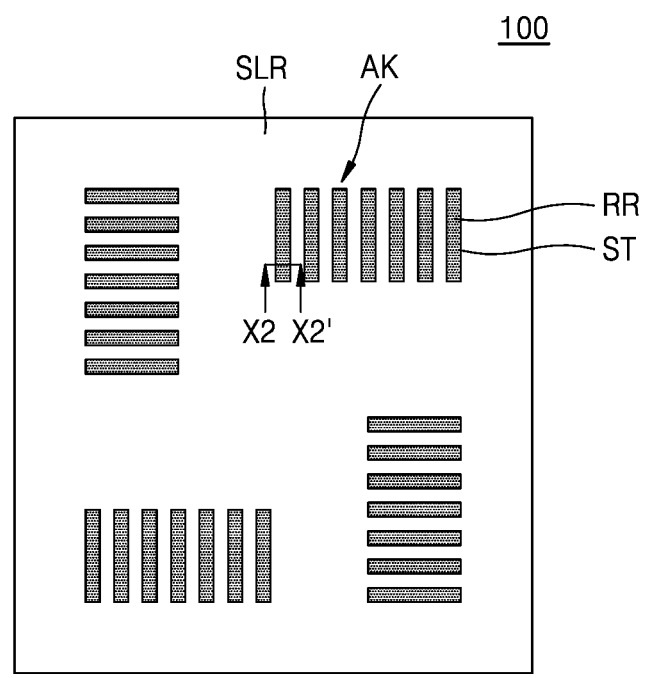
FIG. 2B is a plan view illustrating a configuration of a part of the scribe lane region of an integrated circuit device that may be obtained by a method of manufacturing an integrated circuit device according to example embodiments of the inventive concept.

FIG. 2B is a plan view illustrating a configuration of a part of the scribe lane region SLR of the integrated circuit device 100 of FIG. 1.

Referring to FIG. 2B, in the scribe lane region SLR, a plurality of alignment keys AK may be formed. Each of the plurality of alignment keys AK may include a plurality of step differences ST indicating a plurality of recess areas RR.

FIGS. 3A to 3H are cross-sectional views illustrating processes of a method of manufacturing an integrated circuit device in order according to example embodiments of the inventive concept. Referring to FIGS. 3A to 3H, a method of forming the plurality of island patterns PA and alignment keys AK included in the integrated circuit device 100 illustrated in FIGS. 2A and 2B will be described. In FIGS. 3A to 3H, cross-sections of areas taken along the line X1-X1' of (b) of FIG. 2A and the line X2-X2' of FIG. 2B are illustrated in the process order.

Figure 3A:
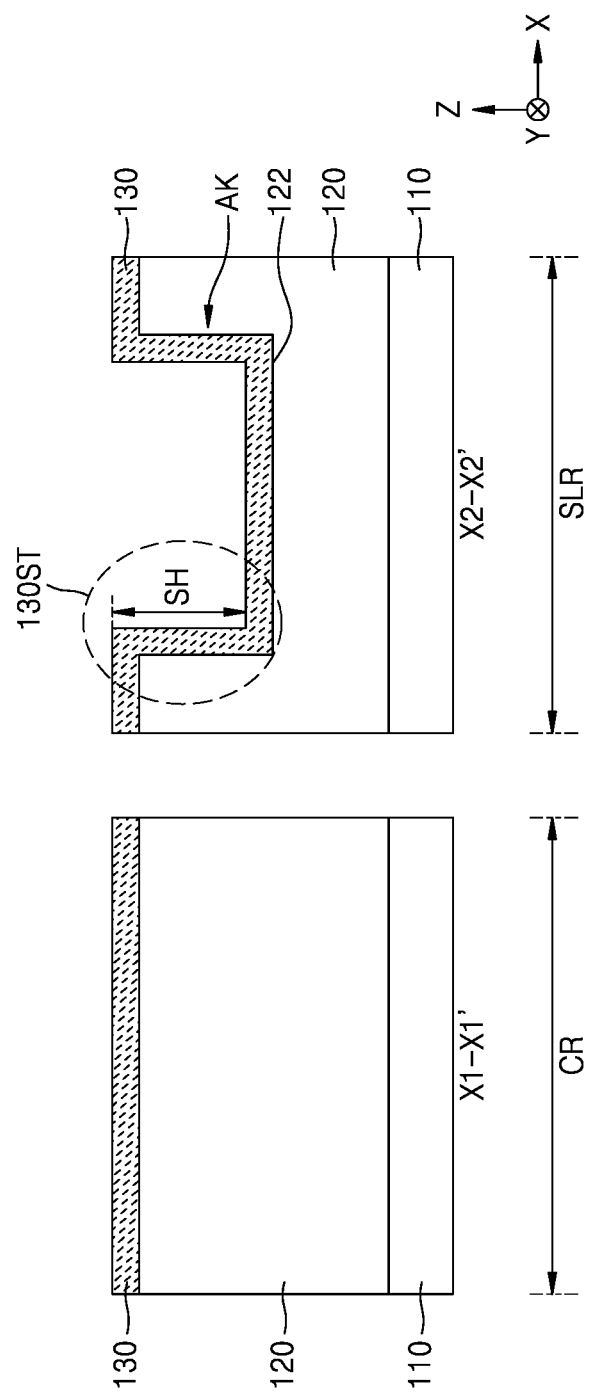
FIGS. 3A to 3H are cross-sectional views illustrating processes of a method of manufacturing an integrated circuit device in order according to example embodiments of the inventive concept.

Referring to FIG. 3A, the lower structure 120 is formed on the substrate 110 and a feature layer 130 is formed on the lower structure 120.

In the chip region CR, an upper surface of the feature layer 130 may evenly extend.

In the scribe lane region SLR, a trench 122 required to form the plurality of alignment keys AK (refer to FIG. 2B) may be formed in an upper surface of the lower structure 120. In the scribe lane region SLR, the feature layer 130 may conformally cover the upper surface of the lower structure 120 and an internal wall of the trench 122. Therefore, in the scribe lane region SLR, in the feature layer 130, as marked with a dashed line in FIG. 3A, a step difference 130ST of a relatively large height SH may be in the periphery of the trench 122. The trench 122 of the lower structure 120 and the step difference 130ST of the feature layer 130 formed thereon may form the alignment key AK. The feature layer 130 may be formed of the same material as a configuration material of the plurality of island patterns PA (refer to FIG. 2A).

Figure 3B:
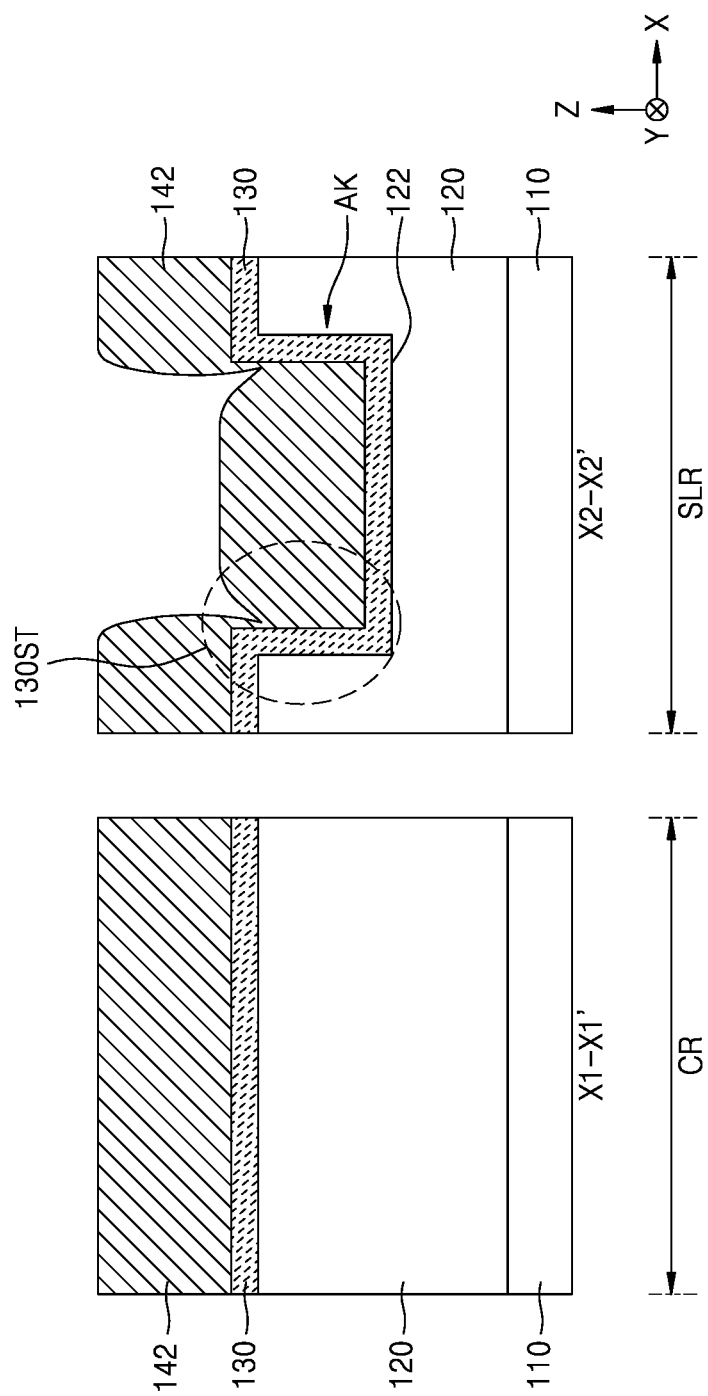

Referring to FIG. 3B, in the chip region CR and the scribe lane region SLR, on the feature layer 130, a first hard mask layer 142 is formed.

In exemplary embodiments, the first hard mask layer 142 may include an amorphous carbon layer (ACL). In order to form the first hard mask layer 142, a chemical vapor deposition (CVD) process may be used. The first hard mask layer 142 may have a thickness of about 1,000 Å to about 2,000 Å.

In the chip region CR, the first hard mask layer 142 may have a uniform thickness without a deviation in thickness in accordance with a position. In the scribe lane region SLR, the thickness of the first hard mask layer 142 may not be uniform. In particular, on the step difference 130ST of the feature layer 130 and the periphery thereof, the step coverage of the first hard mask layer 142 may deteriorate so that, on the step difference 130ST and the periphery thereof, a part of the first hard mask layer 142 may have a thickness much smaller than that of the other part of the first hard mask layer 142.

Figure 3C:
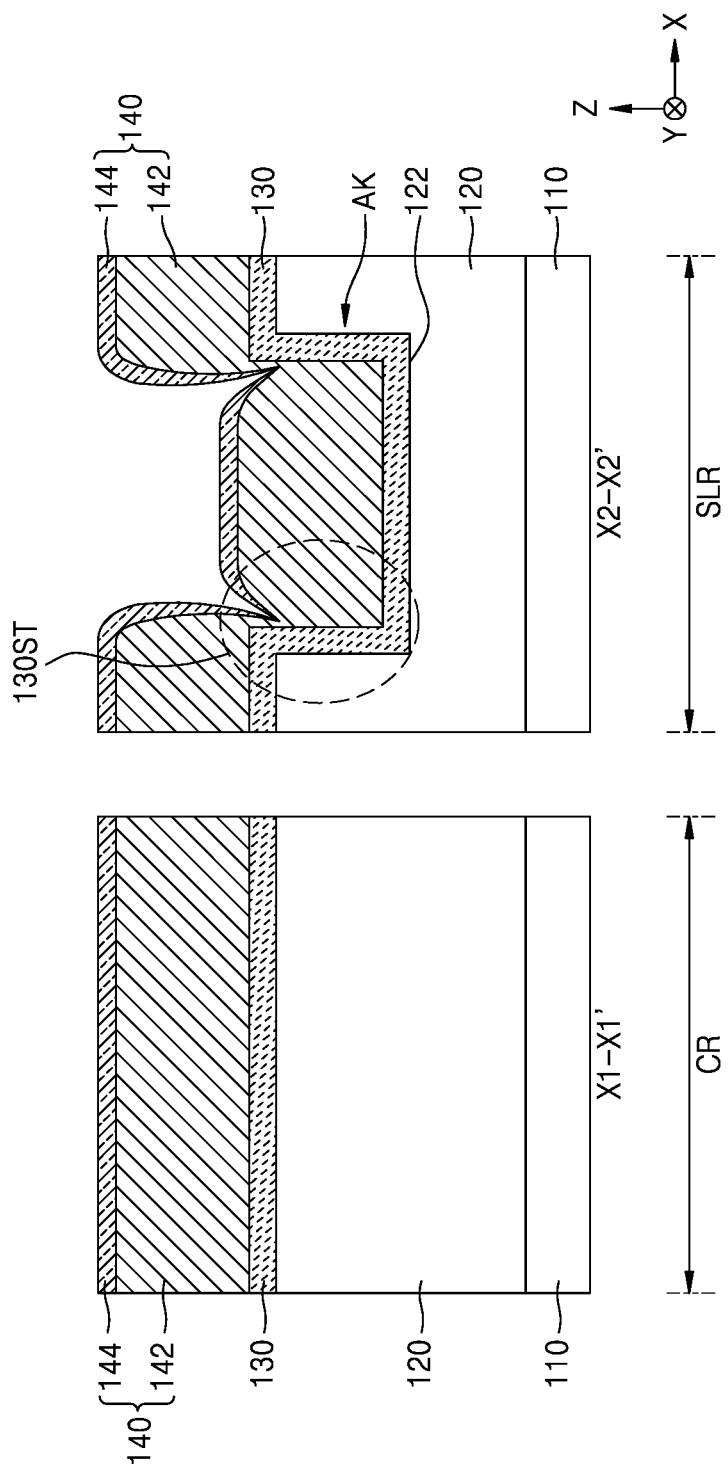

Referring to FIG. 3C, in the chip region CR and the scribe lane region SLR, a second hard mask layer 144 is formed on the first hard mask layer 142.

In exemplary embodiments, the second hard mask layer 144 may include an amorphous silicon layer. In order to form the second hard mask layer 144, the CVD process may be used. The second hard mask layer 144 may have a thickness of about 100 Å to about 800 Å. The first hard mask layer 142 and the second hard mask layer 144 may form a hard mask structure 140.

In the chip region CR, the second hard mask layer 144 may have a uniform thickness without a deviation in thickness in accordance with a position. In the scribe lane region SLR, the thickness of the second hard mask layer 144 may not be uniform. In particular, on the step difference 130ST of the feature layer 130 and the periphery thereof, the step coverage of a part of the second hard mask layer 144 that covers the first hard mask layer 142 deteriorates so that, on the step difference 130ST and the periphery thereof, a part of the second hard mask layer 144 that covers the first hard mask layer 142 may have a thickness much smaller than that of the other part of the second hard mask layer 144.

Figure 3D:
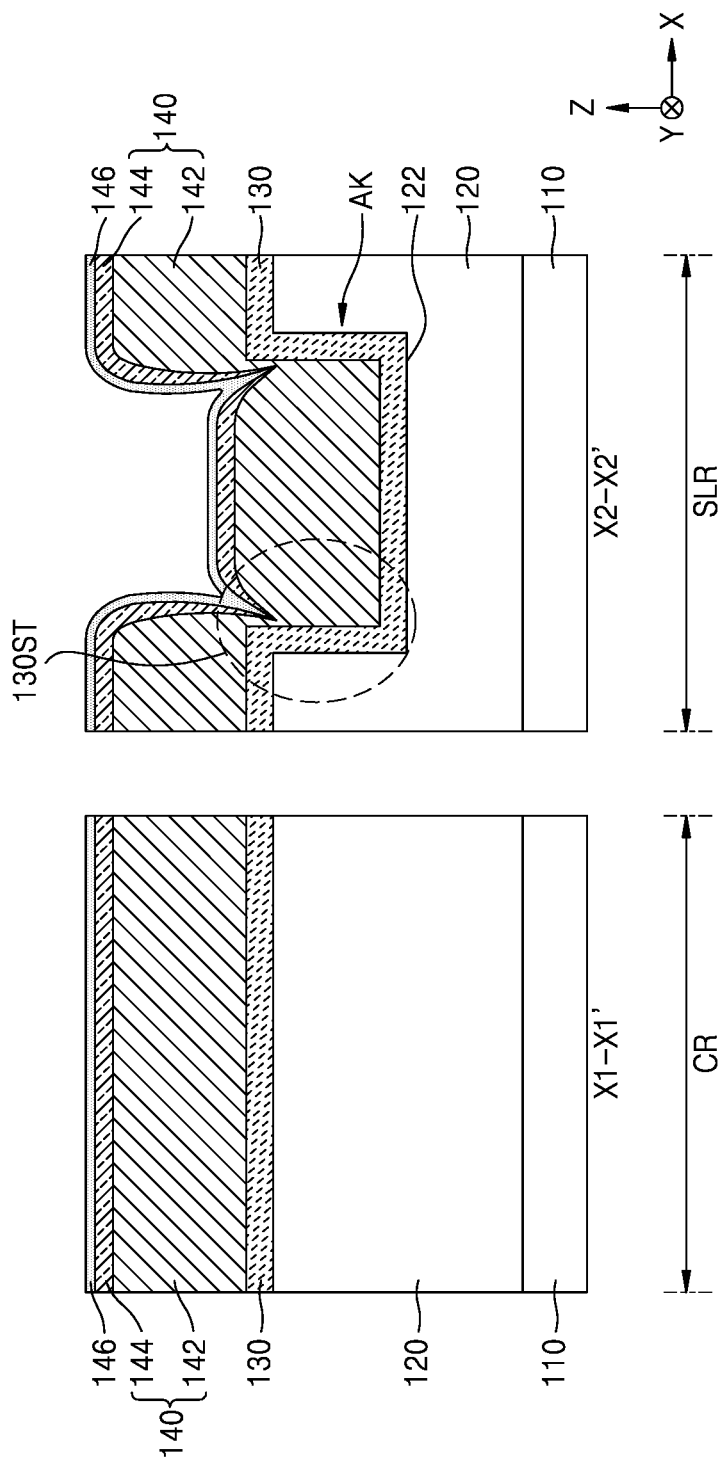

Referring to FIG. 3D, in the chip region CR and the scribe lane region SLR, a protective layer 146 is formed on the hard mask structure 140.

The protective layer 146 may have a uniform thickness in the chip region CR and the scribe lane region SLR. In the scribe lane region SLR, on the step difference 130ST of the feature layer 130 and the periphery thereof, a part of the protective layer 146, which covers the second hard mask layer 144, does not have a thickness less than those of the other parts of the protective layer 146. The protective layer 146 covers the hard mask structure 140 so that the hard mask structure 140 is not exposed to the outside in the chip region CR and the scribe lane region SLR and may maintain a minimum thickness required to protect the hard mask structure 140 in the chip region CR and the scribe lane region SLR.

The protective layer 146 may protect the feature layer 130 and the hard mask structure 140 against a peripheral atmosphere. In exemplary embodiments, the protective layer 146 contacts an upper surface of the second hard mask layer 144 and may prevent the second hard mask layer 144 from being oxidized. The protective layer 146 may be formed of a material different from that of the second hard mask layer 144. In exemplary embodiments, the protective layer 146 may include a silicon containing layer including oxygen atom, nitrogen atom, or a combination of thereof. For example, the protective layer 146 may include a silicon oxide layer, a silicon nitride layer, a silicon oxynitride layer, or a combination of the above layers.

In order to form the protective layer 146, an atomic layer deposition (ALD) process may be used. The protective layer 146 may have a thickness of about 10 Å to about 500 Å. In exemplary embodiments, the protective layer 146 may have a thickness less than that of the second hard mask layer 144. For example, the second hard mask layer 144 may have a thickness of about 150 Å to about 250 Å and the protective layer 146 may have a thickness of about 20 Å to about 80 Å. However, the thicknesses of the second hard mask layer 144 and the protective layer 146 are not limited thereto.

Figure 3E:
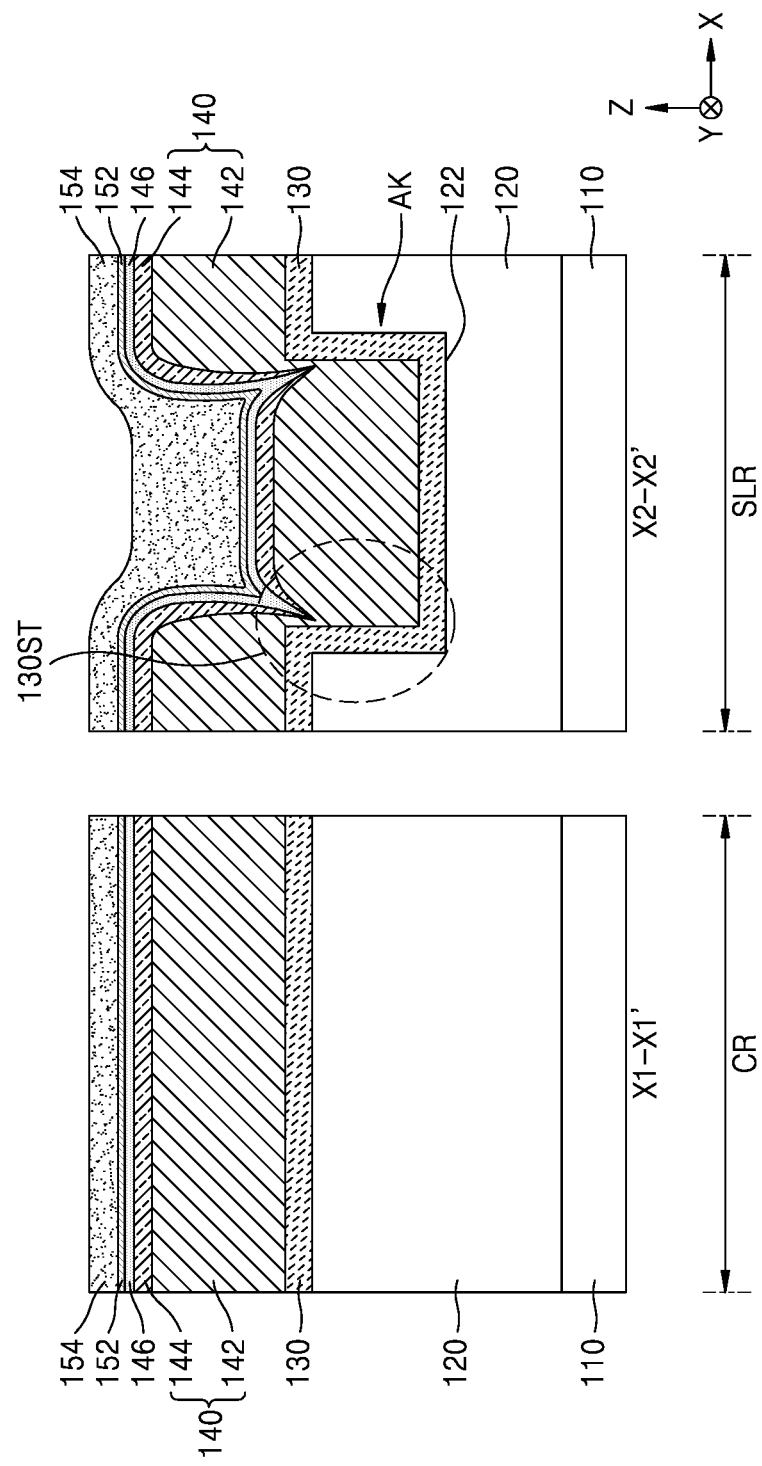

Referring to FIG. 3E, on the protective layer 146, a resist underlayer 152 and a photoresist layer 154 are sequentially formed.

In exemplary embodiments, the resist underlayer 152 may be formed of polymer. For example, the resist underlayer 152 may be formed of polysiloxane. Polysiloxane is a polymer having a siloxane bonds. The polysiloxane may include a repeat unit formed of monosiloxane, di siloxane, tri siloxane, and/or cyclotetrasiloxane.

The resist underlayer 152 may include at least one of a photoacid generator, a crosslinking agent, and an interfacial adhesion enhancer. The photoacid generator as a compound capable of generating acid by light may include, for example, onium salt including triphenylsulfonium trifluoromethanesulfonate, aromatic diazonium salt, sulfonium salt, triarylsulfonium salt, diarylsulfonium salt, monoarylsulfonium salt, iodonium salt, diaryliodonium salt, nitrobenzyl ester, di sulfone, diazo-disulfone, sulfonate, trichloromethyl triazine, or N-hydroxysuccinimide triflate. The crosslinking agent is for crosslinking the repeat unit of polysiloxane. The crosslinking agent may include, for example, melamine, urea, or polyhydric alcohol. The interfacial adhesion enhancer is for increasing adhesion between the resist underlayer 152 and the photoresist layer 154 in order to prevent a pattern from collapsing or peeling in a subsequent process of developing the photoresist layer 154. The interfacial adhesion enhancer may be formed of polymer having a monomer unit including a hydroxyl group.

In other exemplary embodiments, the resist underlayer 152 may be formed of bottom anti-reflective coating (BARC). The BARC may be formed of an organic compound, an inorganic compound, or a combination of the above compounds. For example, the BARC may be formed of a silicon nitride, a silicon oxynitride, amorphous silicon, titanium (Ti), a titanium dioxide, a titanium nitride, a chromium oxide, carbon (C), an organic anti-reflective coating (ARC) material, or a combination of the above materials. The ARC material may be formed of acryl resin having a light absorber and a hydroxyl group that is a crosslinking reactor in the same molecule, or novolak resin having a light absorber and a hydroxyl group that is a crosslinking reactor in the same molecule as. However, the inventive concept is not limited thereto.

In order to form the resist underlayer 152, spin coating, the CVD process, or the ALD process may be used. The resist underlayer 152 may have a thickness of about 10 Å to about 400 Å.

The photoresist layer 154 may be formed of resist for extreme ultraviolet (EUV) (13.5 nm), resist for KrF excimer laser (248 nm), resist for ArF excimer laser (193 nm), or resist for $F_2$ excimer laser (157 nm). The photoresist layer 154 may have a thickness of about 100 Å to about 800 Å.

Figure 3F:
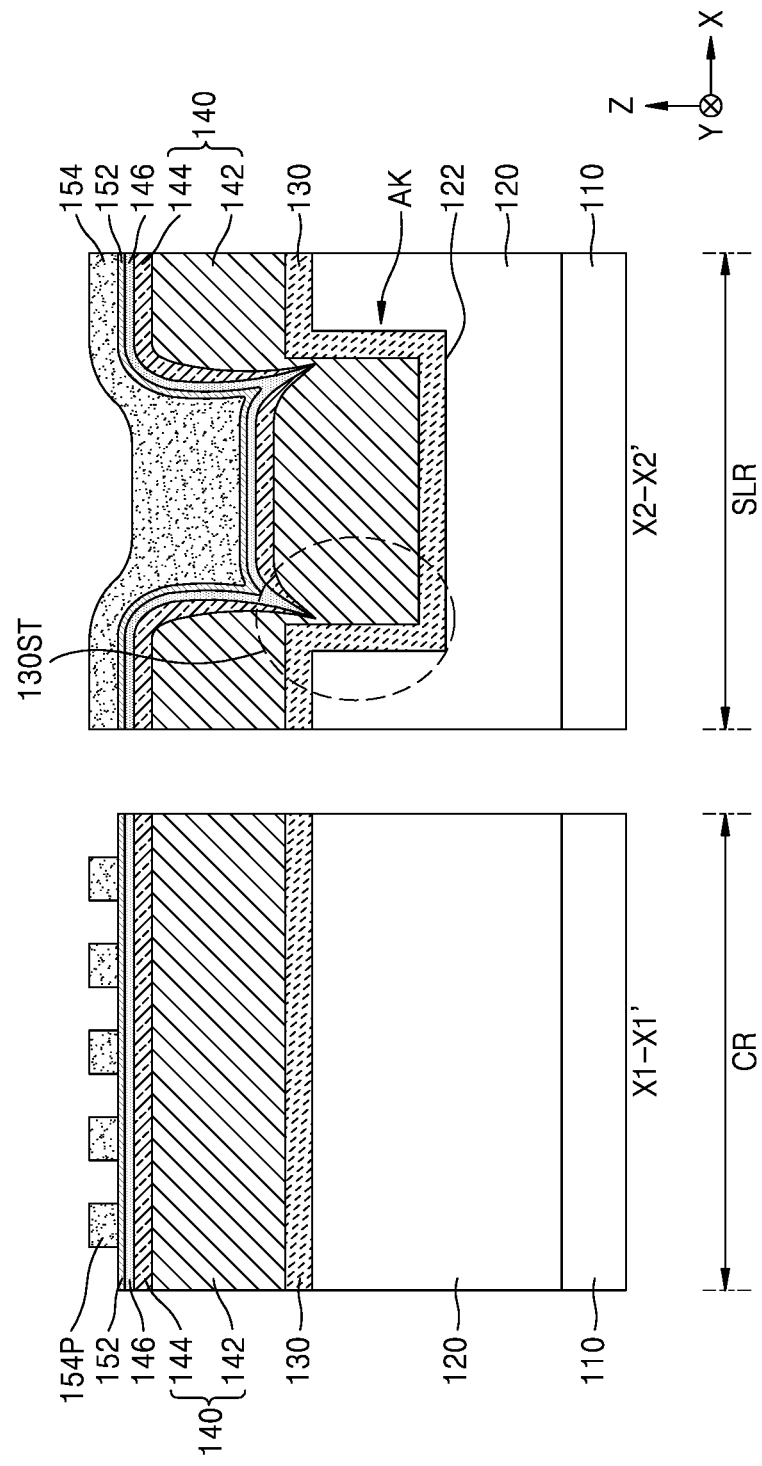

Referring to FIG. 3F, in the chip region CR, by exposing and developing the photoresist layer 154, a photoresist pattern 154P is formed from the photoresist layer 154. In the scribe lane region SLR, the photoresist layer 154 may not be exposed and developed. In exposing the photoresist layer 154, as a light source, EUV (13.5 nm), KrF excimer laser (248 nm), ArF excimer laser, or $F_2$ excimer laser (157 nm) may be used. In the chip region CR, the photoresist pattern 154P may have the same plane shape as those of a plurality of island patterns PA (refer to FIG. 2A) to be formed in the chip region CR. For example, the photoresist pattern 154P may be formed of a plurality of island patterns PA spaced apart from each other and regularly arranged.

Figure 3G:
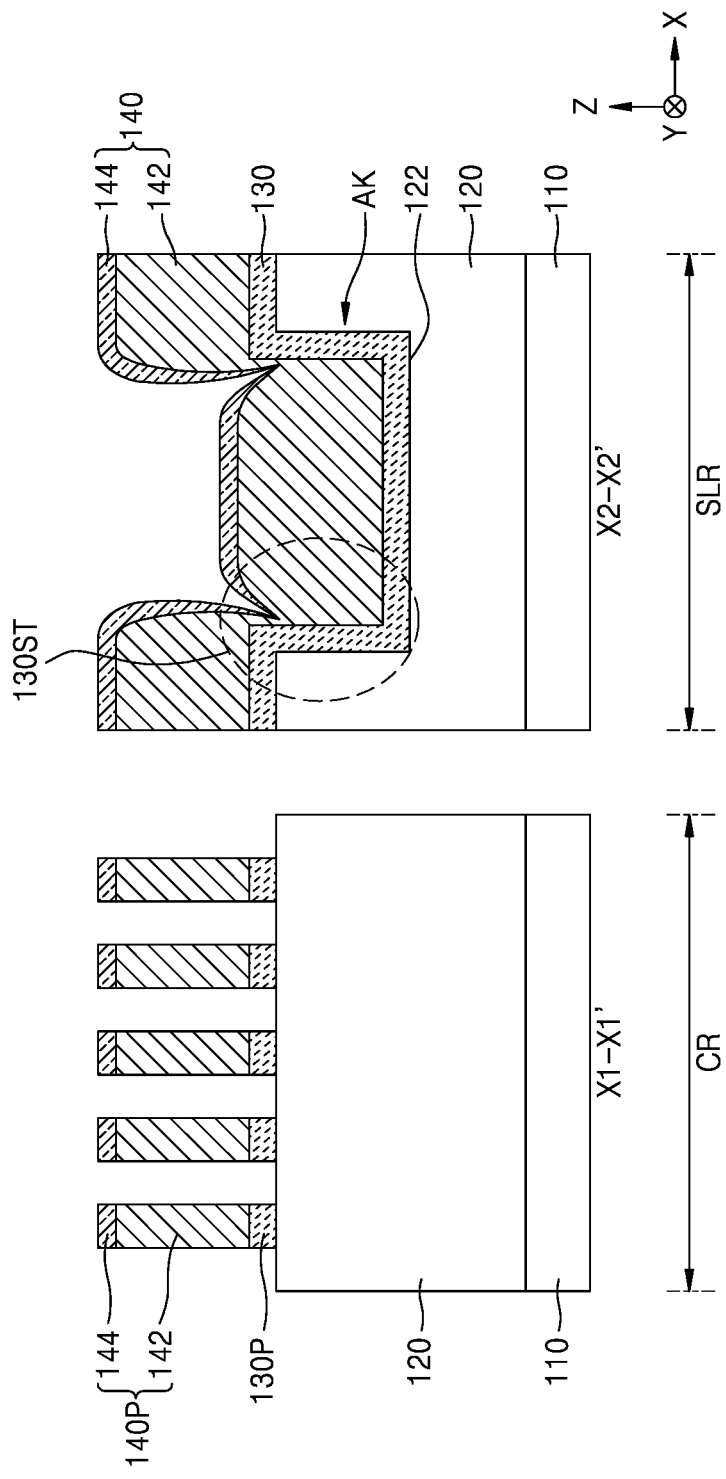

Referring to FIG. 3G, in the resultant material of FIG. 3F, by transcribing the shape of the photoresist pattern 154P to the feature layer 130, a feature pattern 130P is formed.

For example, in the resultant material of FIG. 3F, by using the photoresist pattern 154P as an etching mask, in the chip region CR, the resist underlayer 152, the protective layer 146, and the hard mask structure 140 may be sequentially anisotropically etched. As a result, by etching the hard mask structure 140, in the chip region CR, the hard mask structure pattern 140P may be obtained. By anisotropically etching the feature layer 130 using the hard mask structure pattern 140P in the chip region CR and the hard mask structure 140 in the scribe lane region SLR as etching masks, the feature pattern 130P may be formed in the chip region CR. The feature pattern 130P may form the plurality of island patterns PA illustrated in FIG. 2A.

During an etching process for forming the feature pattern 130P, at least parts of the photoresist pattern 154P, the resist underlayer 152, and the protective layer 146 that are provided on the hard mask structure 140 may be removed at an etching atmosphere. In FIG. 3G, it is illustrated that, in the chip region CR, the first hard mask layer 142 and the second hard mask layer 144 that form the hard mask structure pattern 140P are left on the feature pattern 130P. However, the second hard mask layer 144 may be removed at the etching atmosphere and only a part of the first hard mask layer 142 may be left on the feature pattern 130P.

In exemplary embodiments, after the feature pattern 130P is formed, a part of the lower structure 120 is etched by excessive etching so that, in the chip region CR, a recess area (not shown) may be formed in a partial area of the upper surface of the lower structure 120, which is exposed through the feature pattern 130P. In other exemplary embodiments, in the chip region CR, on the upper surface of the lower structure 120, the above-described recess area may not be formed.

Figure 3H:
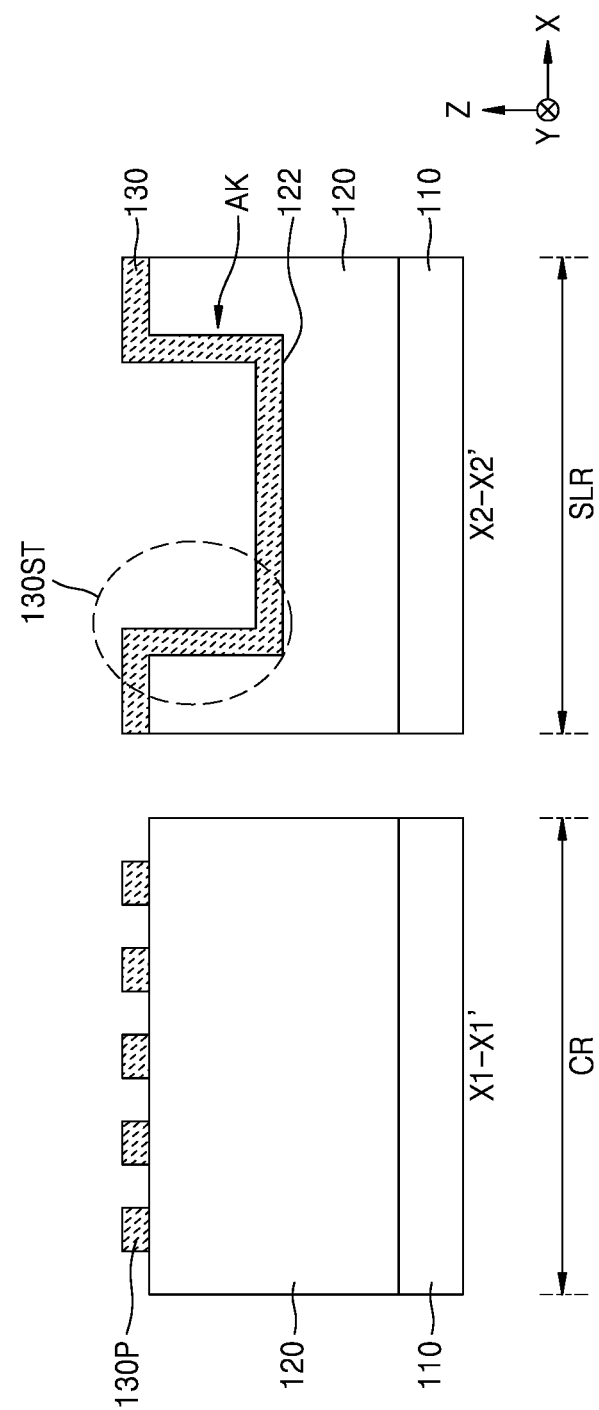

Referring to FIG. 3H, by removing unnecessary materials left on the feature pattern 130P, an upper surface of the feature pattern 130P is exposed. For this purpose, ashing and strip processes may be used. In the scribe lane region SLR, the upper surface of the feature layer 130 that forms the alignment key AK may be exposed again.

Figure 4B:
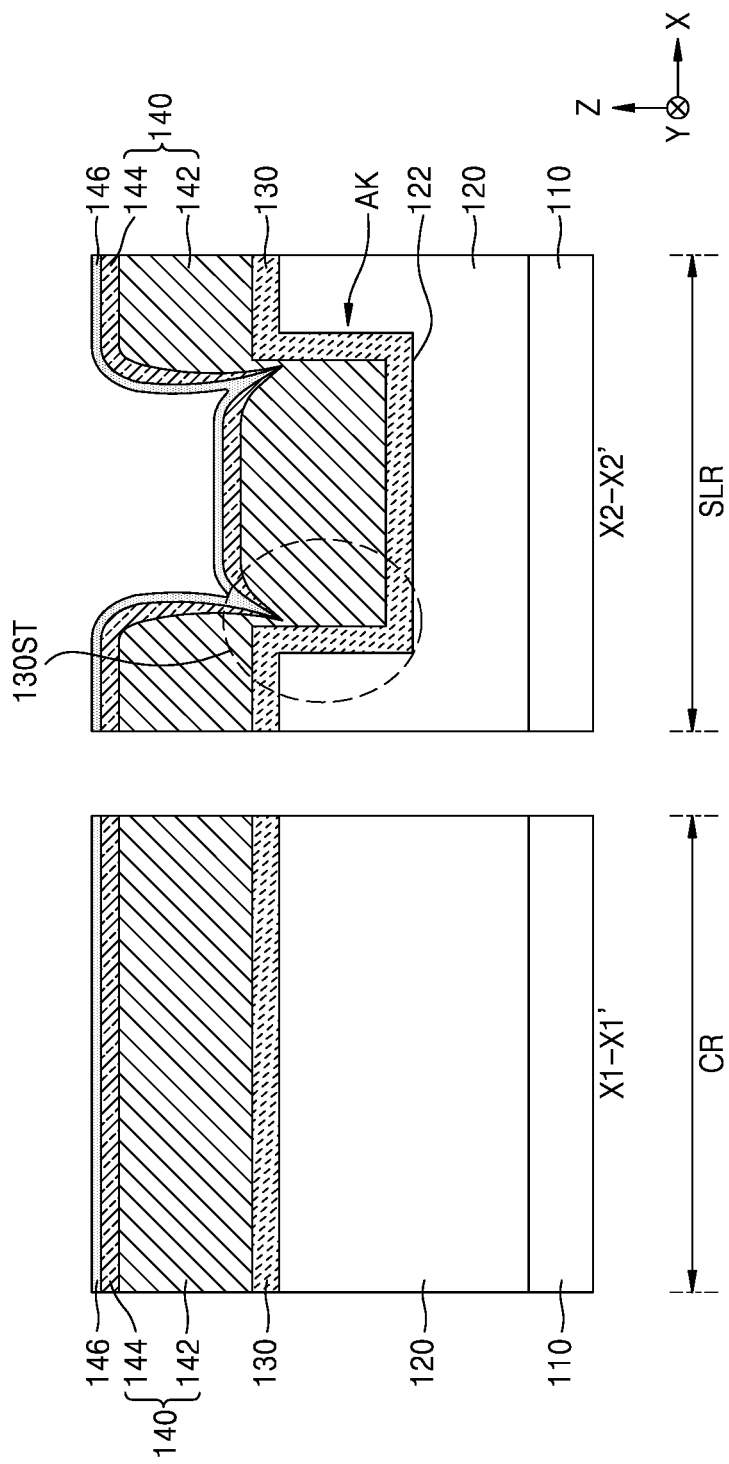
Figure 4C:
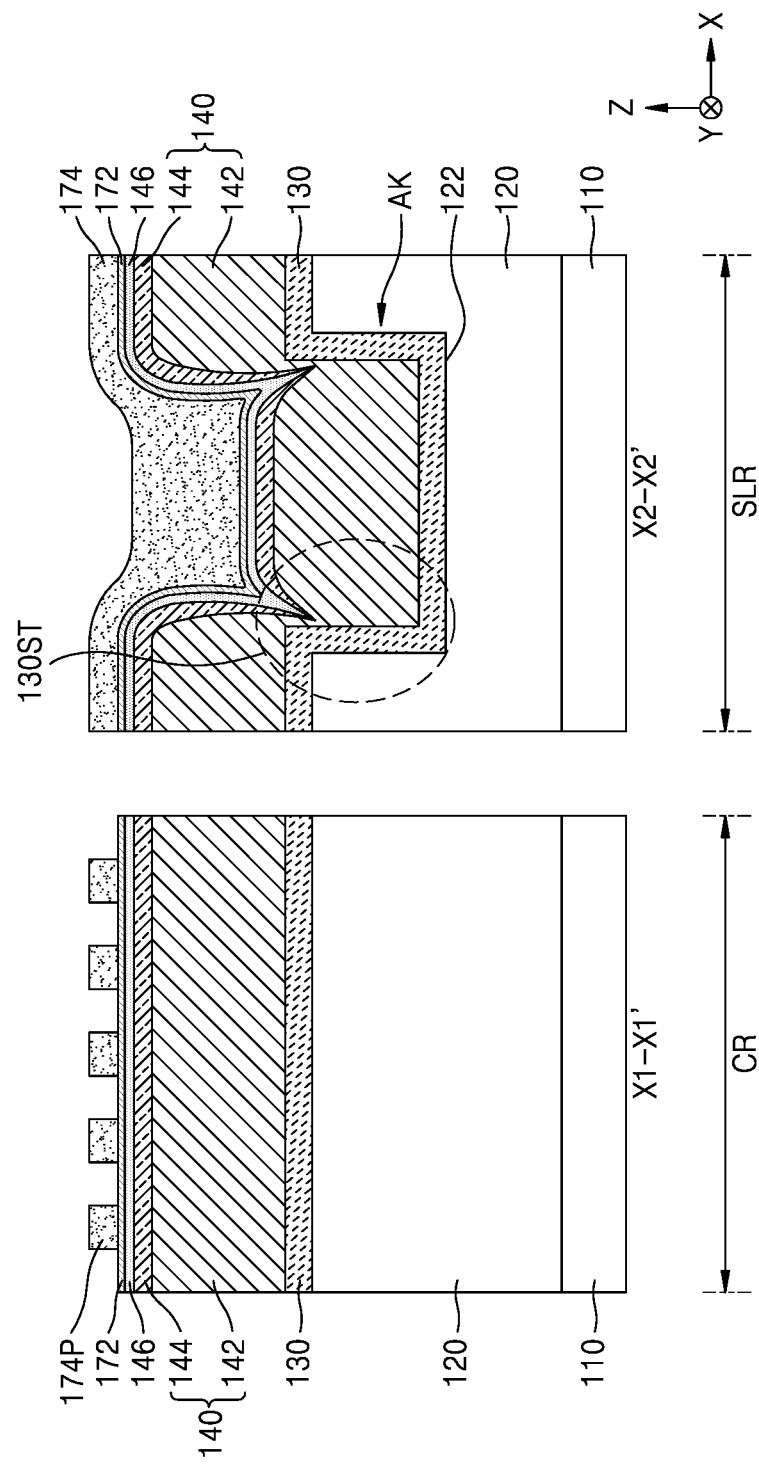

FIGS. 4A to 4C are cross-sectional views illustrating processes of a method of manufacturing an integrated circuit device in order according to other example embodiments of the inventive concept. Referring to FIGS. 4A to 4C, another method of forming the plurality of island patterns PA and alignment keys AK included in the integrated circuit device 100 illustrated in FIGS. 2A and 2B is described. In FIGS. 4A and 4B, cross-sections of areas corresponding to the cross-section taken along the line X1-X1' (b) of FIG. 2A and the cross-section taken along the line X2-X2' of FIG. 2B are illustrated in order.

Referring to FIG. 4A, by the same method as described with reference to FIGS. 3A and 3F, a process for forming the photoresist pattern 154P on the substrate 110 is performed. Then, by examining the photoresist pattern 154P, an alignment state and defects of the photoresist pattern 154P may be checked. As a result of examining the photoresist pattern 154P, when it is determined that the photoresist pattern 154P is defective, in a subsequent etching process, it is difficult to use the photoresist pattern 154P as an etching mask and it is necessary to perform a rework process for removing the photoresist pattern 154P and forming a new photoresist pattern. For example, as a result of examining the photoresist pattern 154P, when a wiggling phenomenon in which the photoresist pattern 154P is winding, a striation phenomenon in which a surface of the photoresist pattern 154P is rough, a phenomenon in which the photoresist pattern 154P falls, or a phenomenon in which an alignment state of the photoresist pattern 154P deviates from tolerance occurs, it may be determined that the photoresist pattern 154P is defective.

For the rework process, the photoresist pattern 154P in the chip region CR and the photoresist layer 154 in the scribe lane region SLR may be exposed to a rework atmosphere 160.

In exemplary embodiments, the rework atmosphere 160 may include an oxygen containing atmosphere. For example, the photoresist pattern 154P in the chip region CR and the photoresist layer 154 in the scribe lane region SLR may be removed by a plasma ashing process at the oxygen containing atmosphere. In another example, in order to remove the photoresist pattern 154P and the photoresist layer 154, by irradiating ultraviolet (UV) rays at the oxygen containing atmosphere, $O_3$ and/or oxygen radical are generated and the photoresist pattern 154P and the photoresist layer 154 may be decomposed into $CO_2$ and $H_2O$ by using $O_3$ and oxygen radical. In a case in which the resist underlayer 152 is formed of polymer or an organic compound, when the photoresist pattern 154P in the chip region CR and the photoresist layer 154 in the scribe lane region SLR are removed, the resist underlayer 152 may be also removed.

In other exemplary embodiments, the rework atmosphere 160 may be a wet atmosphere including a thinner composition. The thinner composition may include at least one compound selected from ethyl lactate, ethyl-3-ethoxy propionate, gamma-butyro lactone, acetone, an ester compound, propylene glycol alkyl ether acetate, cycloketone, and methyl 2-hydroxy isobutyrate. However, a kind of the compound that may be included in the thinner composition is not limited thereto.

Referring to FIG. 4B, after removing the photoresist pattern 154P in the chip region CR and the photoresist layer 154 in the scribe lane region SLR by the same method as described with reference to FIG. 4A, in the chip region CR and the scribe lane region SLR, the protective layer 146 may be exposed.

While the rework process described with reference to FIG. 4A is performed, the protective layer 146 may protect the hard mask structure 140 thereunder against the rework atmosphere 160.

For example, when the protective layer 146 is omitted, while the photoresist pattern 154P and the photoresist layer 154 are removed by the same method as described with reference to FIG. 4A, the hard mask structure 140 may be exposed to the rework atmosphere 160. In this case, in the scribe lane region SLR, since the first hard mask layer 142 and the second hard mask layer 144 include vulnerable portions having much smaller thicknesses than that of the other portion due to deteriorated step coverage around the step difference 130ST of the feature layer 130 and oxygen or a thinner composition included in the rework atmosphere 160 permeate into the vulnerable portions, around the step difference 130ST, the feature layer 130, the first hard mask layer 142, and/or the second hard mask layer 144 may be partially removed or damaged. When the above-described result occurs (i.e., removing or damaging the feature layer 130, the first hard mask layer 142, and/or the second hard mask layer 144), the alignment key AK in the scribe lane region SLR may not perform a normal alignment key function.

According to the inventive concept, since the second hard mask layer 144 that is the uppermost layer of the hard mask structure 140 is covered with the protective layer 146 and, in particular, in the periphery of the step difference 130ST of the feature layer 130, since the protective layer 146 covers the second hard mask layer 144 so that the second hard mask layer 144 is not exposed, while the photoresist pattern 154P and the photoresist layer 154 are removed by the same method as described with reference to FIG. 4A, in the scribe lane region SLR, the feature layer 130 and the hard mask structure 140 may be prevented from being damaged or transformed. Therefore, when a photolithography process for forming a new photoresist pattern on the protective layer 146 is performed in a subsequent process, precise control may be smoothly performed by using the alignment key AK in the scribe lane region SLR.

Referring to FIG. 4C, after sequentially forming a resist underlayer 172 and a photoresist layer 174 that cover the protective layer 146 by a method similar to that described with reference to FIG. 3E in the chip region CR and the scribe lane region SLR of the resultant material of FIG. 4B, by exposing and developing the photoresist layer 174 in the chip region CR by using the alignment key AK in the scribe lane region SLR by a method similar to that described with reference to FIG. 3F, a photoresist pattern 174P is formed from the photoresist layer 174.

In exemplary embodiments, after forming the photoresist pattern 174P, by a method similar to that described with reference to FIGS. 4A to 4C, an examining process and a rework process of the photoresist pattern 174P and a new photoresist pattern forming process may be further performed at least once. Then, by performing processes described with reference to FIGS. 3G and 3H, in the chip region CR, the feature pattern 130P is formed on the lower structure 120 and, in the scribe lane region SLR, the upper surface of the feature layer 130 that forms the alignment key AK may be exposed again.

By the method of manufacturing the integrated circuit device according to the example embodiments of the inventive concept, which is described with reference to FIGS. 4A to 4C, when a photolithography process is performed in order to pattern the feature layer 130 in the chip region CR, the protective layer 146 for protecting the hard mask structure 140 is formed on the hard mask structure 140 and a photolithography process for forming the photoresist layer 154 on the protective layer 146 is performed. Therefore, after forming the photoresist layer 154, when a rework process for removing the photoresist layer 154 and forming the photoresist layer 174 is performed, in the periphery of the step difference 130ST of the feature layer 130 in the scribe lane region SLR, although a partial area of the hard mask structure 140 includes a portion vulnerable to the rework atmosphere 160 due to deteriorated step coverage of the hard mask structure 140, since the hard mask structure 140 is covered with the protective layer 146, while the rework process is performed, in the scribe lane region SLR, the feature layer 130 and/or the hard mask structure 140 may be prevented from being damaged or transformed. Therefore, in a subsequent process, when a photolithography process for forming the photoresist pattern 174P on the protective layer 146 is performed, precise control may be smoothly performed by using the alignment key AK in the scribe lane region SLR.

Figure 5:
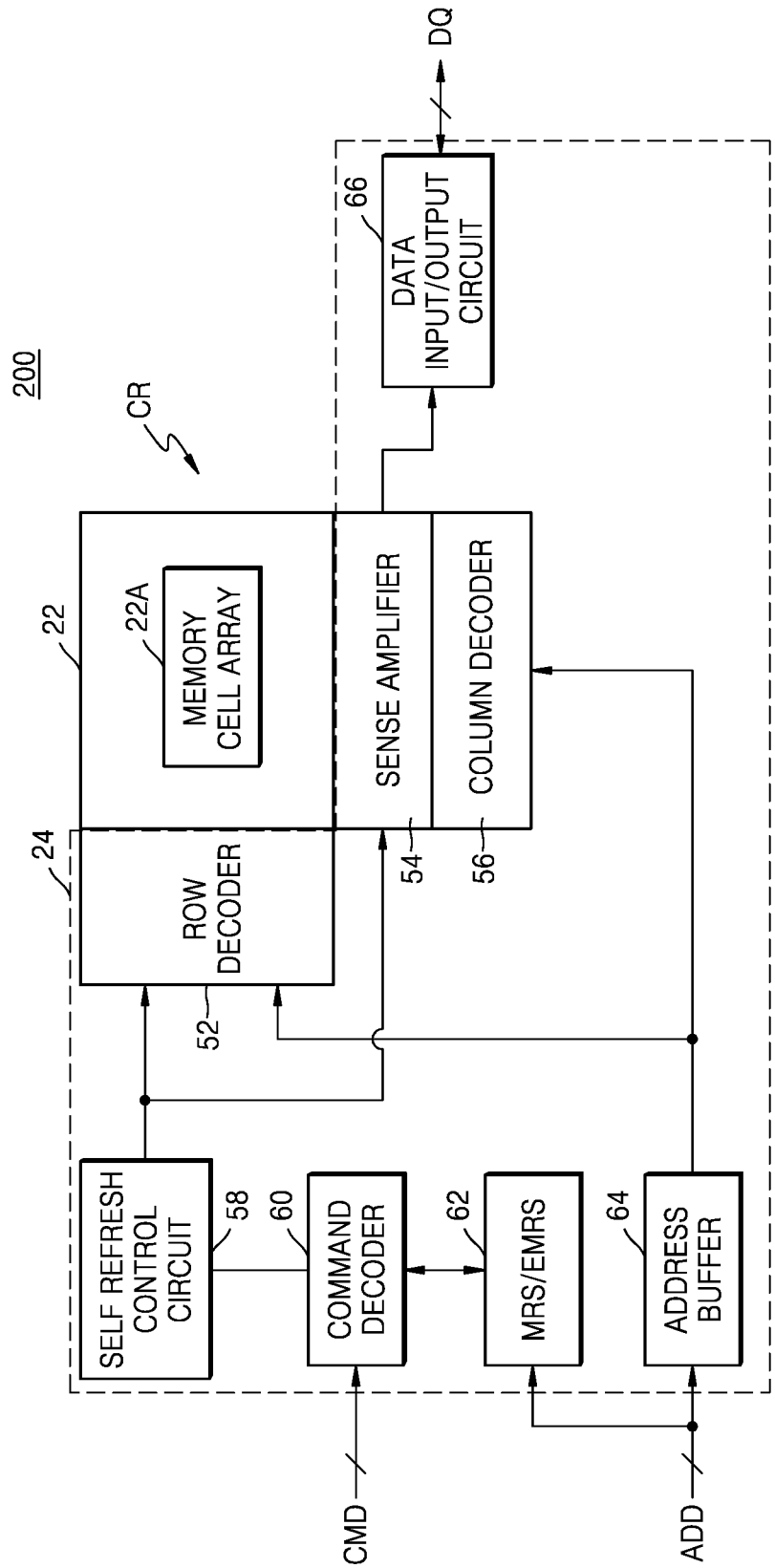
FIG. 5 is a block diagram illustrating another exemplary configuration of an integrated circuit device that may be obtained by a method of manufacturing an integrated circuit device according to example embodiments of the inventive concept.

FIG. 5 is a block diagram illustrating an exemplary configuration of an integrated circuit device 200 according to example embodiments of the inventive concept.

Referring to FIG. 5, the integrated circuit device 200 may be formed in a corresponding chip region CR of the integrated circuit device 100 illustrated in FIG. 1. The chip region CR of the integrated circuit device 200 may include a first area 22 and a second area 24. The first area 22 may be a memory cell area of a dynamic random access memory (DRAM) device, and the second area 24 may be a peripheral circuit area of the DRAM device. In some embodiments, the semiconductor memory device formed in chip region CR may be a DRAM device. In other embodiments, the semiconductor memory device formed in chip region CR may be a static random access memory (SRAM), a NAND flash memory, a NOR flash memory, a phase random access memory (PRAM), a ferroelectric random access memory (FRAM), a resistive random access memory (RRAM), or a magnetic random access memory (MRAM). The first area 22 may include a memory cell array 22A. The second area 24 may include a row decoder 52, a sense amplifier 54, a column decoder 56, a self-refresh control circuit 58, a command decoder 60, a mode register set (MRS)/extended mode register set (EMRS) circuit 62, an address buffer 64, and a data input/output circuit 66.

Figure 6:
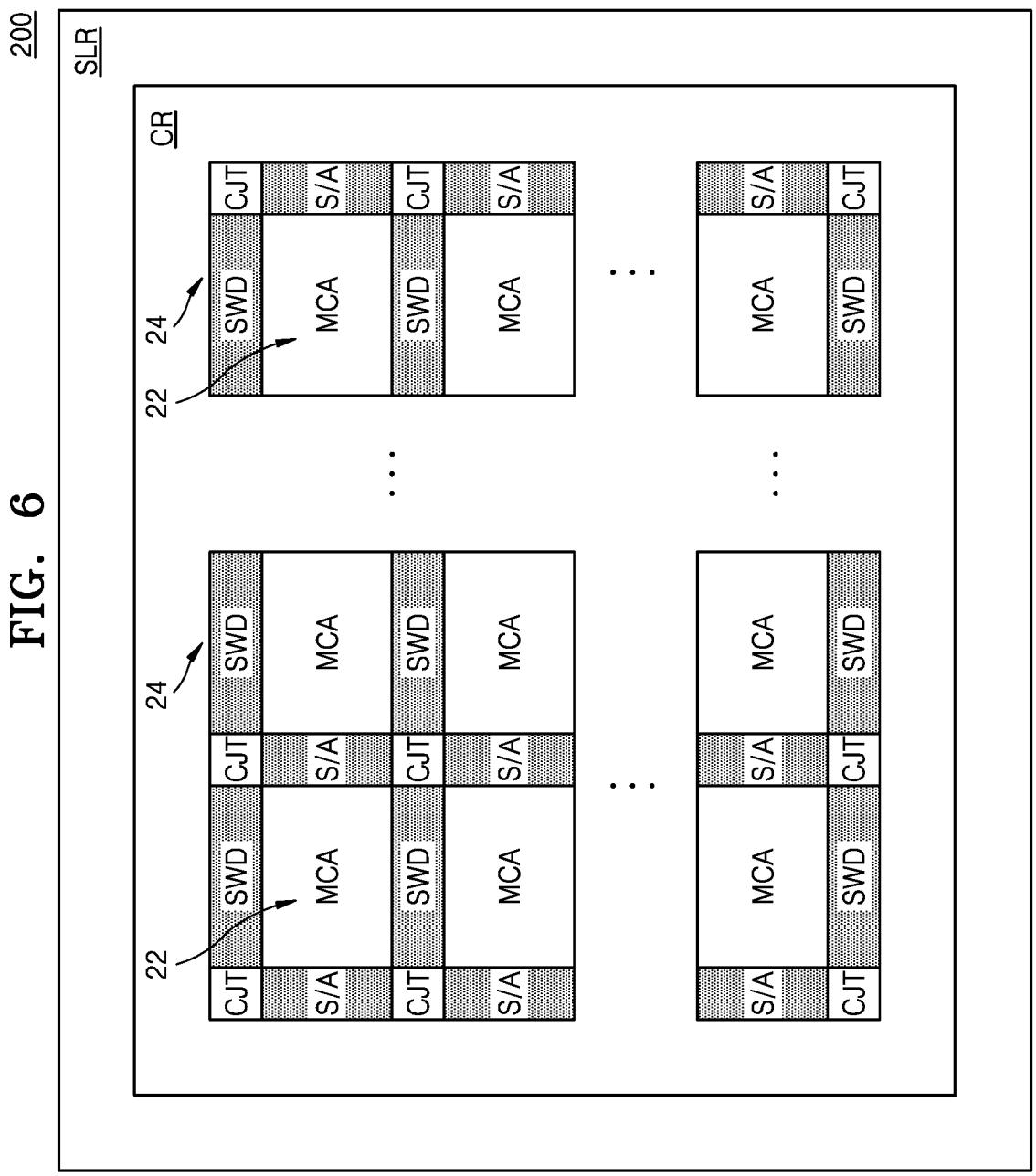
FIG. 6 is a plan view illustrating an exemplary arrangement configuration of the integrated circuit device of FIG. 5.

FIG. 6 is a plan view illustrating an exemplary arrangement configuration of the integrated circuit device 200 of FIG. 5.

Referring to FIG. 6, the chip region CR of the integrated circuit device 200 may be surrounded by the scribe lane region SLR. The chip region CR of the integrated circuit device 200 may include a plurality of first areas 22, and each of the plurality of first areas 22 may be surrounded by the second area 24. The first areas 22 may be a cell array region MCA of the DRAM device, and the second area 24 may be a peripheral circuit area and a core area in which peripheral circuits of the DRAM device are formed.

In the first areas 22, the cell array region MCA may include the memory cell array 22A described with reference to FIG. 5. The second area 24 may include a sub-word line driver block SWD, a sense amplifier block S/A, and a conjunction block CJT. In the sense amplifier block S/A, a plurality of bit line sense amplifiers may be arranged. The conjunction block CJT may be arranged at a point at which the sub-word line driver block SWD and the sense amplifier block S/A intersect each other. In the conjunction block CJT, power drivers and ground drivers for driving the plurality of bit line sense amplifiers may be alternately arranged. In the second area 24, a peripheral circuit such as an inverter chain or an input/output circuit may be further formed.

Figure 7:
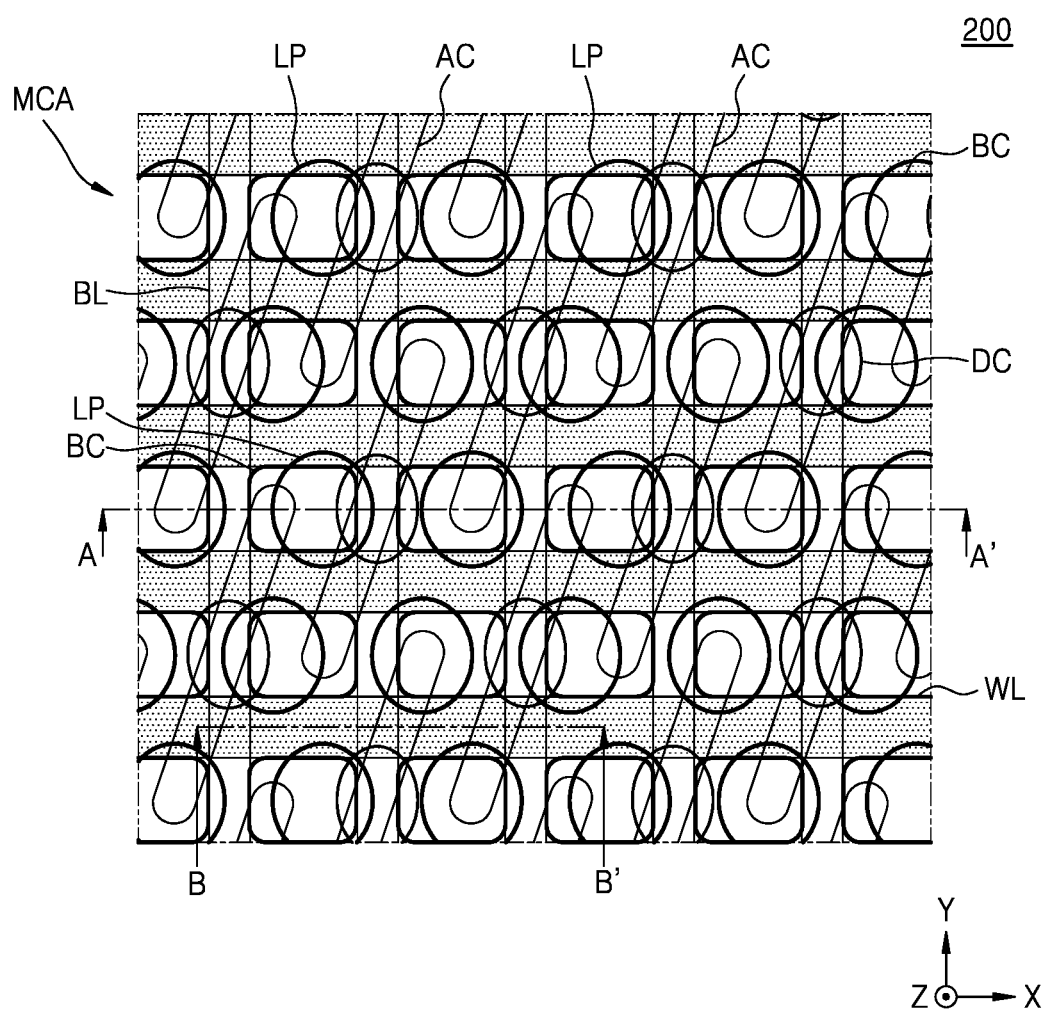
FIG. 7 is a schematic plan layout illustrating main configurations of a cell array region of FIG. 6.

FIG. 7 is a schematic plan layout illustrating main components of the cell array region MCA of FIG. 6.

Referring to FIG. 7, the cell array region MCA may include a plurality of active areas AC. Each of the plurality of active areas AC may be arranged to have a long axis in an oblique direction with respect to X and Y directions. A plurality of word lines WL may extend in parallel across the plurality of active areas AC in the X direction. On the plurality of word lines WL, a plurality of bit lines BL may extend in parallel in the Y direction. The plurality of bit lines BL may be connected to the plurality of active areas AC through a plurality of direct contacts DC. In the plurality of bit lines BL, between two adjacent bit lines BL, a plurality of buried contacts BC may be formed. The plurality of buried contacts BC may be arranged in line in the X and Y directions. On the plurality of buried contacts BC, a plurality of conductive landing pads LP may be formed. The plurality of buried contacts BC and the plurality of conductive landing pads LP may connect a lower electrode (not shown) of a capacitor formed on the plurality of bit lines BL to the plurality of active areas AC. The plurality of conductive landing pads LP may partially overlap the plurality of buried contacts BC.

Figure 8A:
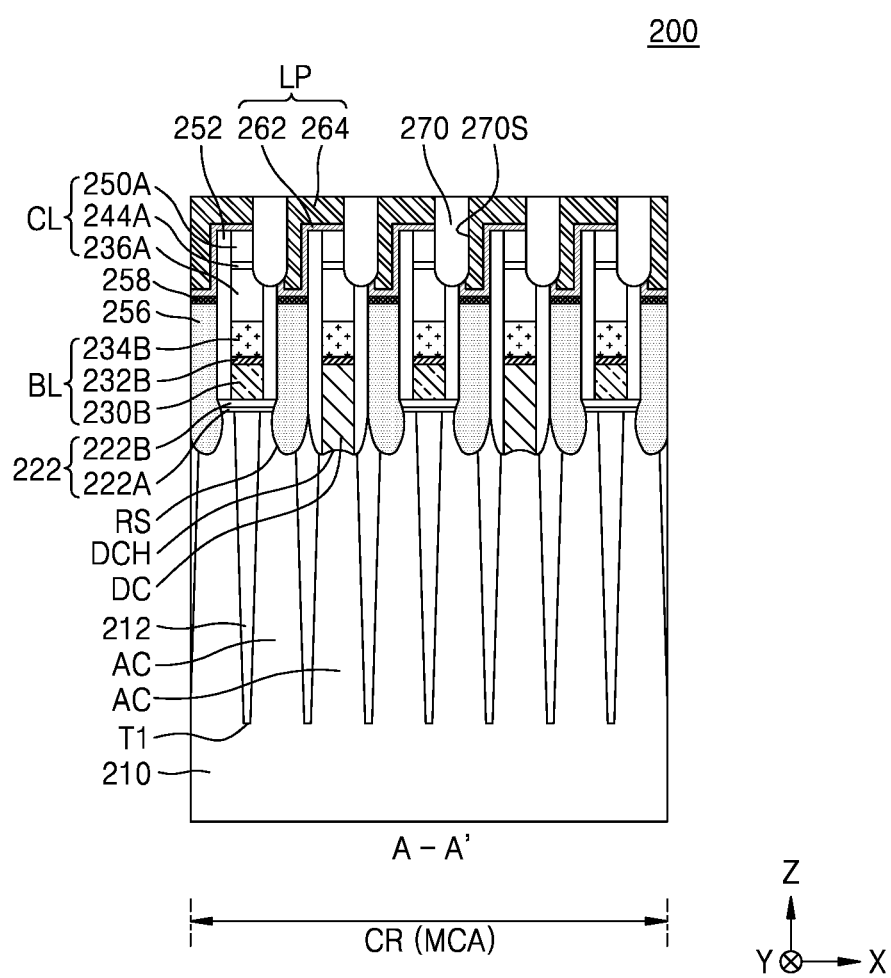
FIGS. 8A and 8B are cross-sectional views illustrating a cross-sectional configuration of a partial area of a cell array region included in an integrated circuit device that may be obtained by a method of manufacturing an integrated circuit device according to example embodiments of the inventive concept.
Figure 8B:
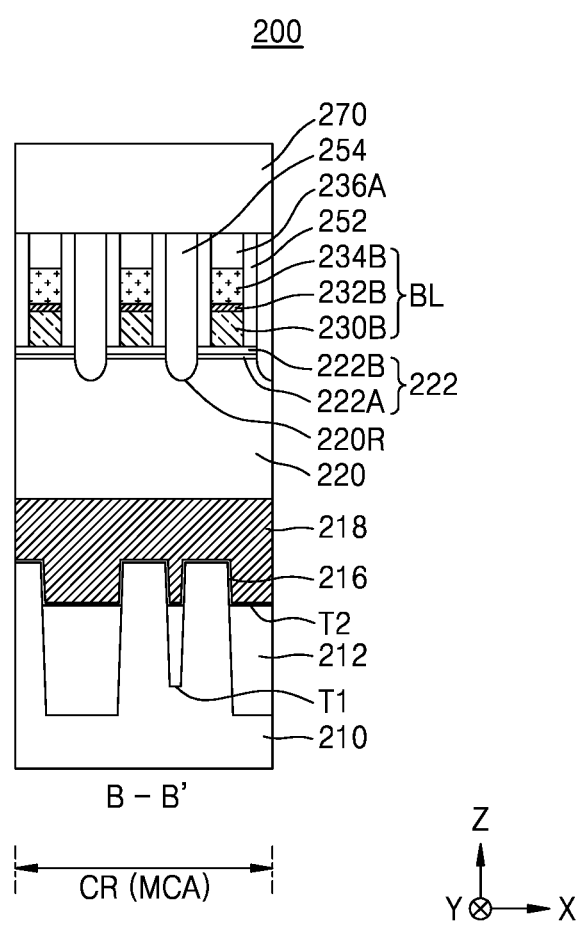

FIGS. 8A and 8B are cross-sectional views illustrating a cross-sectional configuration of a partial area of a cell array region MCA included in the integrated circuit device 200 of FIGS. 5 to 7. FIG. 8A illustrates a cross-sectional configuration of a partial area taken along the line A-A' of FIG. 7 and FIG. 8B illustrates a cross-sectional configuration of a partial area taken along the line B-B' of FIG. 7.

Referring to FIGS. 8A and 8B, in the cell array region MCA of the integrated circuit device 200, a plurality of device isolation trenches T1 are formed in a substrate 210 and, in the plurality of device isolation trenches T1, a plurality of device isolation layers 212 are formed. In the cell array region MCA, the plurality of active areas AC may be defined by the plurality of device isolation layers 212 in the substrate 210.

The substrate 210 may include silicon, for example, single crystal silicon, polycrystalline silicon, or amorphous silicon. In other embodiments, the substrate 210 may include at least one selected from germanium (Ge), SiGe, SiC, GaAs, InAs, and InP. In some embodiments, the substrate 210 may include a conductive area, for example, a well doped with impurities or a structure doped with impurities. Each of the device isolation layers 212 may include an oxide layer, a nitride layer, or a combination of the above layers.

In the cell array region MCA, in the substrate 210, a plurality of word line trenches T2 that extend in a first horizontal direction (the X direction) are formed and, in the plurality of word line trenches T2, a plurality of gate dielectric layers 216, a plurality of word lines 218, and a plurality of buried insulating layers 220 are formed. The plurality of word lines 218 may correspond to the plurality of word lines WL illustrated in FIG. 7. On upper surfaces of the plurality of buried insulating layers 220, a plurality of recess spaces 220R may be formed. The plurality of gate dielectric layers 216 may include a silicon oxide layer, a silicon nitride layer, a silicon oxynitride layer, an oxide/nitride/oxide (ONO) layer, or a high-k dielectric layer having a dielectric constant higher than that of a silicon oxide layer. For example, the plurality of gate dielectric layers 216 may include $HfO_2$, $Al_2O_3$, $HfAlO_3$, $Ta_2O_3$, or $TiO_2$. The plurality of word lines 218 may be formed of Ti, TiN, tantalum (Ta), TaN, tungsten (W), WN, TiSiN, WSiN, or a combination of the above metals. The plurality of buried insulating layers 220 may include a silicon oxide layer, a silicon nitride layer, a silicon oxynitride layer, or a combination of the above layers.

In the cell array region MCA, a buffer layer 222 may be formed on the substrate 210. The buffer layer 222 may include a first insulating layer 222A and a second insulating layer 222B. Each of the first insulating layer 222A and the second insulating layer 222B may include an oxide layer, a nitride layer, or a combination of the above layers. In a plurality of direct contact holes DCH on the substrate 210, the plurality of direct contacts DC may be formed. The plurality of direct contacts DC may be connected to the plurality of active areas AC. The plurality of direct contacts DC may be formed of Si, Ge, W, WN, cobalt (Co), nickel (Ni), aluminum (Al), molybdenum (Mo), ruthenium (Ru), Ti, TiN, Ta, TaN, copper (Cu), or a combination of the above metals.

On the substrate 210 and the plurality of direct contacts DC, the plurality of bit lines BL may longitudinally extend in a second horizontal direction (the Y direction). The plurality of bit lines BL may be respectively connected to the plurality of active areas AC through the plurality of direct contacts DC. Each of the plurality of bit lines BL may include a lower conductive pattern 230B, an intermediate conductive pattern 232B, and an upper conductive pattern 234B that are sequentially stacked on the substrate 210. The lower conductive pattern 230B may be formed of doped polysilicon. In some examples, the lower conductive pattern 230B may be formed of the same as the direct contact DC. Each of the intermediate conductive pattern 232B and the upper conductive pattern 234B may be formed of TiN, TiSiN, W, tungsten silicide, or a combination of the above metals. In exemplary embodiments, the intermediate conductive pattern 232B may be formed of TiN, TiSiN, or a combination of the above metals and the upper conductive pattern 234B may be formed of W. The plurality of bit lines BL may be respectively covered with a plurality of insulation capping lines CL. Each of the plurality of insulation capping lines CL may include a lower insulation capping pattern 236A, an insulation thin film pattern 244A, and an upper insulation capping pattern 250A. Each of the lower insulation capping pattern 236A, the insulating thin film pattern 244A, and the upper insulation capping pattern 250A may include a silicon nitride layer.

Side walls of the plurality of bit lines BL and the plurality of insulation capping lines CL may be covered with a plurality of insulating spacers 252. The plurality of insulating spacers 252 may longitudinally extend to run parallel with the plurality of bit lines BL in the Y direction. Each of the plurality of insulating spacers 252 may include an oxide layer, a nitride layer, an air spacer, or a combination of the above materials. In the current specification, the term "air" may mean the air or a space including other gases that may be in manufacturing processes.

Among the plurality of bit lines BL, a plurality of conductive plugs 256 and a plurality of insulating fences 254 may be arranged in line in the Y direction. The plurality of conductive plugs 256 may longitudinally extend from a recess space RS formed in the substrate 210 in a vertical direction (a Z direction). The plurality of insulating fences 254 may fill the plurality of recess spaces 220R formed on the upper surface of the buried insulating layer 220 and may be arranged among the plurality of conductive plugs 256 one by one. In the Y direction, both side walls of each of the plurality of conductive plugs 256 may be covered with the plurality of insulating fences 254. The plurality of conductive plugs 256 arranged in line in the Y direction may be insulated from each other by the plurality of insulating fences 254. Each of the plurality of insulating fences 254 may include a silicon nitride layer. The plurality of conductive plugs 256 may form the plurality of buried contacts BC illustrated in FIG. 7.

On the plurality of conductive plugs 256, a plurality of metal silicide layers 258 and a conductive layer 260 (refer to FIG. 9A) may be sequentially formed. The conductive layer 260 may include a conductive barrier layer 262 and a main conductive layer 264. Each of the plurality of conductive landing pads LP may include the conductive layer 260. The plurality of metal silicide layers 258 and the plurality of conductive landing pads LP may vertically overlap the plurality of conductive plugs 256. Each of the plurality of metal silicide layers 258 may be formed of cobalt silicide, nickel silicide, or manganese silicide. The plurality of conductive landing pads LP may be respectively connected to the plurality of conductive plugs 256 through the plurality of metal silicide layers 258. The plurality of conductive landing pads LP may cover at least a part of an upper surface of the upper insulation capping pattern 250A so as to vertically overlap parts of the plurality of bit lines BL. The conductive barrier layer 262 may be formed of Ti, TiN, or a combination of the above metals. The main conductive layer 264 may be formed of metal, metal nitride, conductive polysilicon, or a combination of the above materials. For example, the main conductive layer 264 may include W. In a plane view, the plurality of conductive landing pads LP may be in the form of a plurality of island patterns PA. The plurality of conductive landing pads LP may be electrically insulated from each other by a plurality of insulating layers 270 that fill insulating spaces 270S around the plurality of conductive landing pads LP. Each of the plurality of insulating layers 270 may include a silicon nitride layer, a silicon oxide layer, or a combination of the above layers.

FIGS. 9A to 9E are cross-sectional views illustrating processes of a method of manufacturing an integrated circuit device in order according to example embodiments of the inventive concept. In FIGS. 9A to 9E, some components of the cell array region MCA included in the chip region CR and some components in the scribe lane region SLR are illustrated in the order.

Figure 9A:
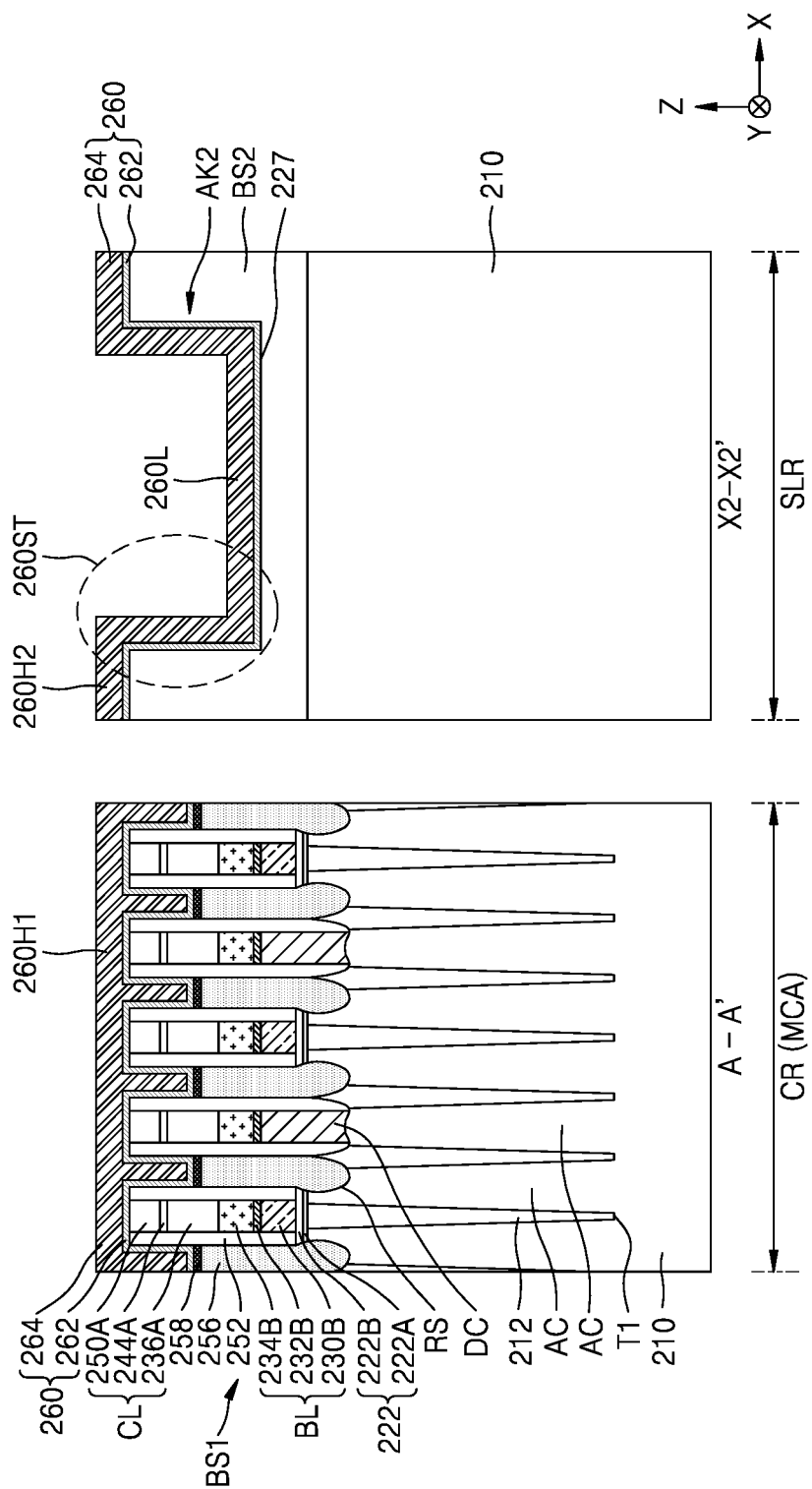

Referring to FIG. 9A, in the cell array region MCA, on the substrate 210, a first lower structure BS1 including the plurality of bit lines BL, the plurality of conductive plugs 256 interposed among the plurality of bit lines BL, the plurality of insulation capping lines CL formed on the plurality of bit lines BL and the plurality of metal silicide layers 258 that cover upper surfaces of the plurality of conductive plugs 256 may be formed and, in the scribe lane region SLR, on the substrate 210, a second lower structure BS2, in which a trench 227 is formed, may be formed. The second lower structure BS2 may include an insulating layer.

Then, the conductive layer 260 that covers the first lower structure BS1 in the cell array region MCA and the second lower structure BS2 in the scribe lane region SLR is formed.

FIGS. 10A to 10J are cross-sectional views illustrating processes of forming the first lower structure BS1 of FIG. 9A and the conductive layer 260 that covers the first lower structure BS1 in the cell array region MCA in the order.

Figure 10A:
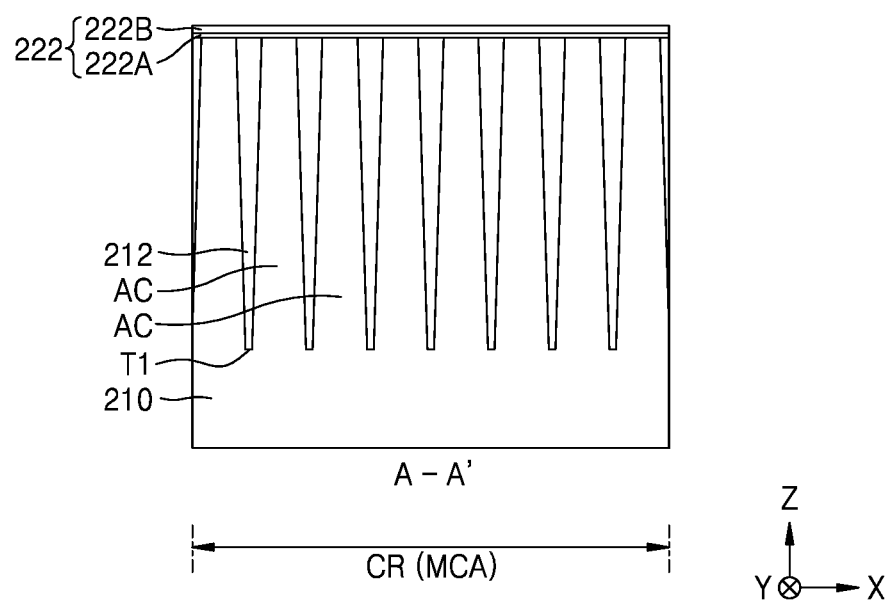
FIGS. 10A to 10J are cross-sectional views illustrating processes of forming a first lower structure and a conductive layer in a cell array region in a method of manufacturing an integrated circuit device in order according to example embodiments of the inventive concept.

Referring to FIG. 10A, in the cell array region MCA, in the substrate 210, the plurality of device isolation trenches T1 and the plurality of device isolation layers 212 are formed so that the plurality of active areas AC are defined in the substrate 210. Then, in the substrate 210, the plurality of word line trenches T2 illustrated in FIG. 8B may be formed. After washing the resultant material in which the plurality of word line trenches T2 are formed, in the plurality of word line trenches T2, the plurality of gate dielectric layers 216, the plurality of word lines 218, and the plurality of buried insulating layers 220 may be sequentially formed. In the plurality of active areas AC, by implanting impurity ions into both sides of each of the plurality of word lines 218, on the plurality of active areas AC, a plurality of source/drain areas may be formed. In exemplary embodiments, the plurality of source/drain areas may be formed before forming the plurality of word lines 218. Then, on the substrate 210, the buffer layer 222 is formed.

Figure 10B:
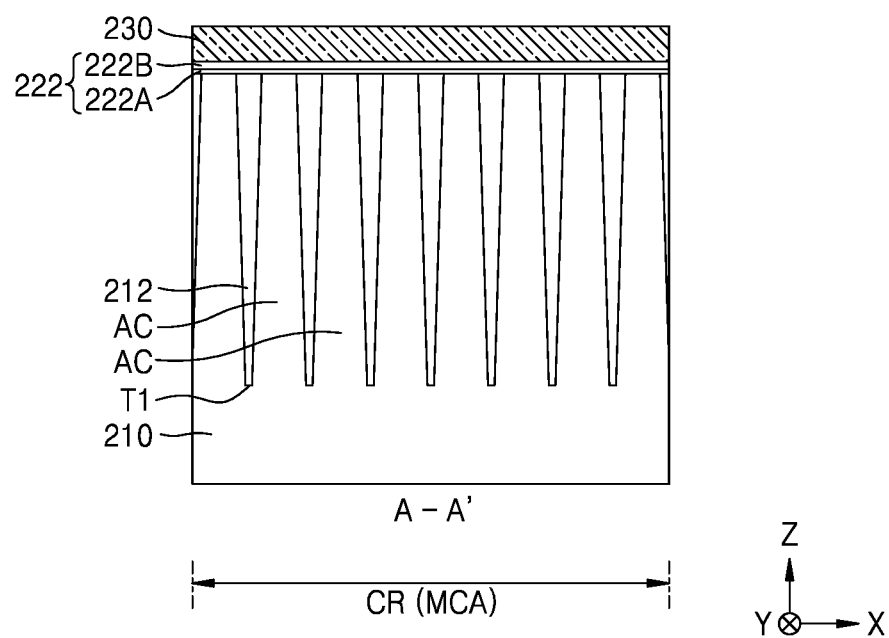

Referring to FIG. 10B, in the cell array region MCA, a lower conductive layer 230 is formed on the buffer layer 222.

Figure 10C:
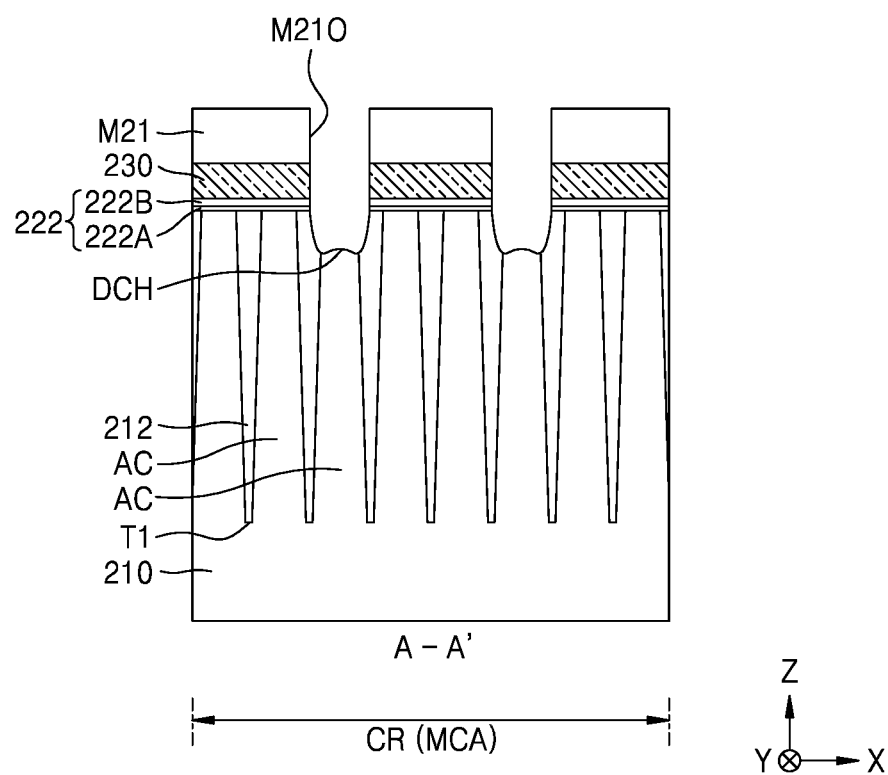

Referring to FIG. 10C, after forming a mask pattern M21 on the lower conductive layer 230, in the cell array region MCA, by etching the lower conductive layer 230 exposed through an opening M210 of the mask pattern M21 and a part of the substrate 210 and a part of the device isolation layer 212 that are exposed as a result of etching the lower conductive layer 230, the plurality of direct contact holes DCH that expose the plurality of active areas AC of the substrate 210 are formed. The mask pattern M21 may include an oxide layer, a nitride layer, or a combination of the above layers.

Figure 10D:
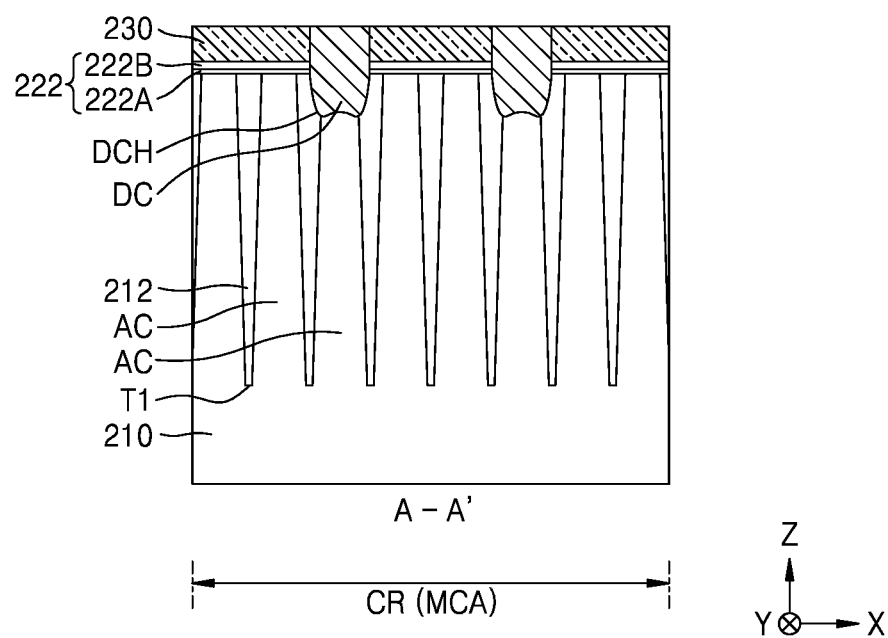

Referring to FIG. 10D, the mask pattern M21 is removed from the resultant material of FIG. 10C and the plurality of direct contacts DC are formed in the plurality of direct contact holes DCH. In an exemplary process for forming the plurality of direct contacts DC, in the plurality of direct contact holes DCH and on the lower conductive layer 230, a conductive layer of a thickness enough to fill the plurality of direct contact holes DCH may be formed and the conductive layer may be etched back so that the conductive layer is left only in the plurality of direct contact holes DCH. The conductive layer may be formed of Si, Ge, W, WN, Co, Ni, Al, Mo, Ru, Ti, TiN, Ta, TaN, Cu, or a combination of the above metals.

Figure 10E:
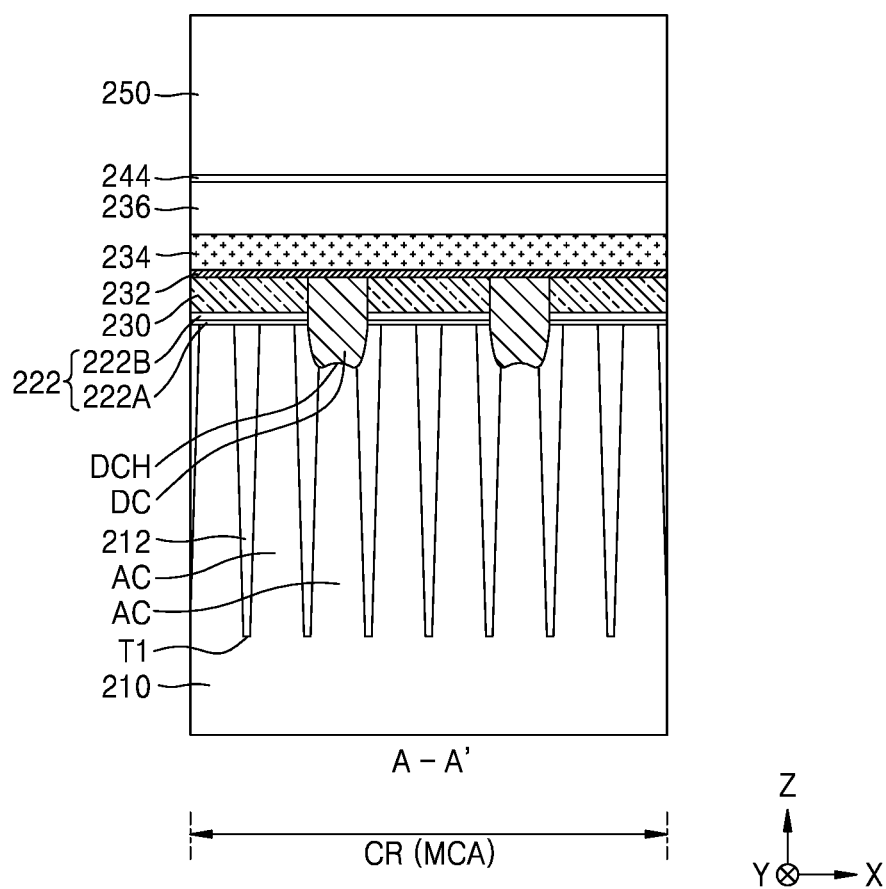

Referring to FIG. 10E, in the cell array region MCA, on the lower conductive layer 230 and the plurality of direct contacts DC, an intermediate conductive layer 232 and an upper conductive layer 234 are formed and, on the upper conductive layer 234, a lower insulation capping layer 236, an insulating thin film 244, and an upper insulation capping layer 250 are sequentially formed.

Each of the intermediate conductive layer 232 and the upper conductive layer 234 may be formed of TiN, TiSiN, W, tungsten silicide, or a combination of the above metals. Each of the lower insulation capping layer 236, the insulating thin film 244, and the upper insulation capping layer 250 may include a silicon nitride layer.

Figure 10F:
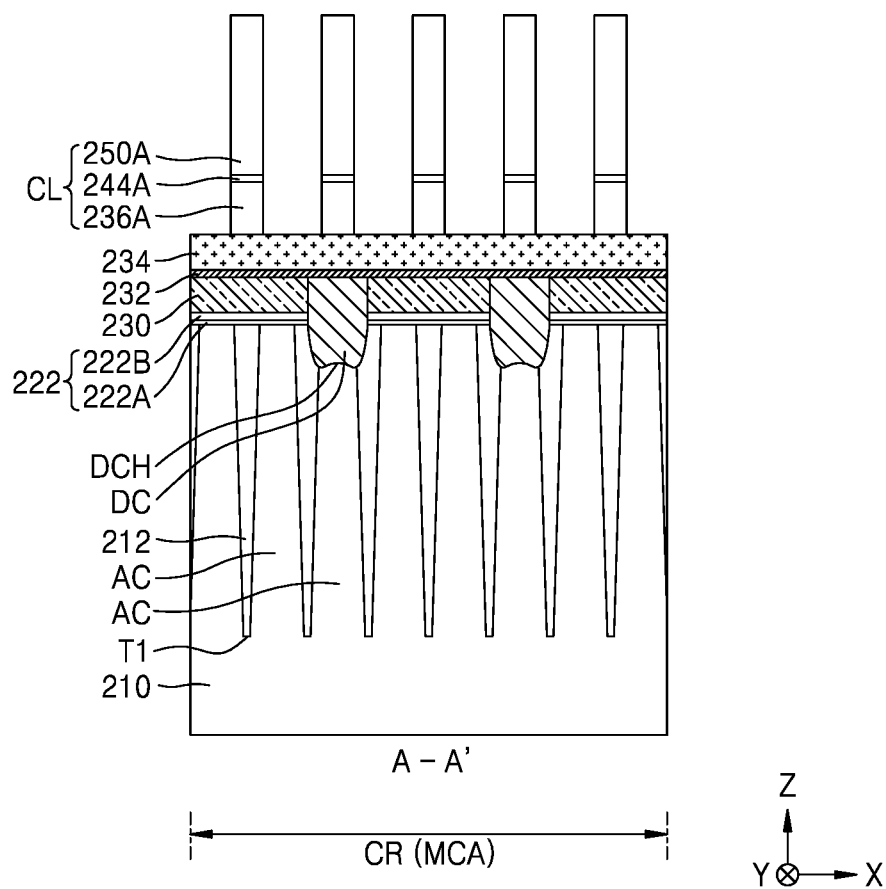

Referring to FIG. 10F, in the resultant material of FIG. 10E, by patterning the upper insulation capping layer 250, the insulating thin film 244, and the lower insulation capping layer 236 in the cell array region MCA by a photolithography process, the plurality of insulation capping lines CL including lower insulation capping patterns 236A, insulating thin film patterns 244A, and upper insulation capping patterns 250A that are sequentially stacked on the upper conductive layer 234 are formed.

Figure 10G:
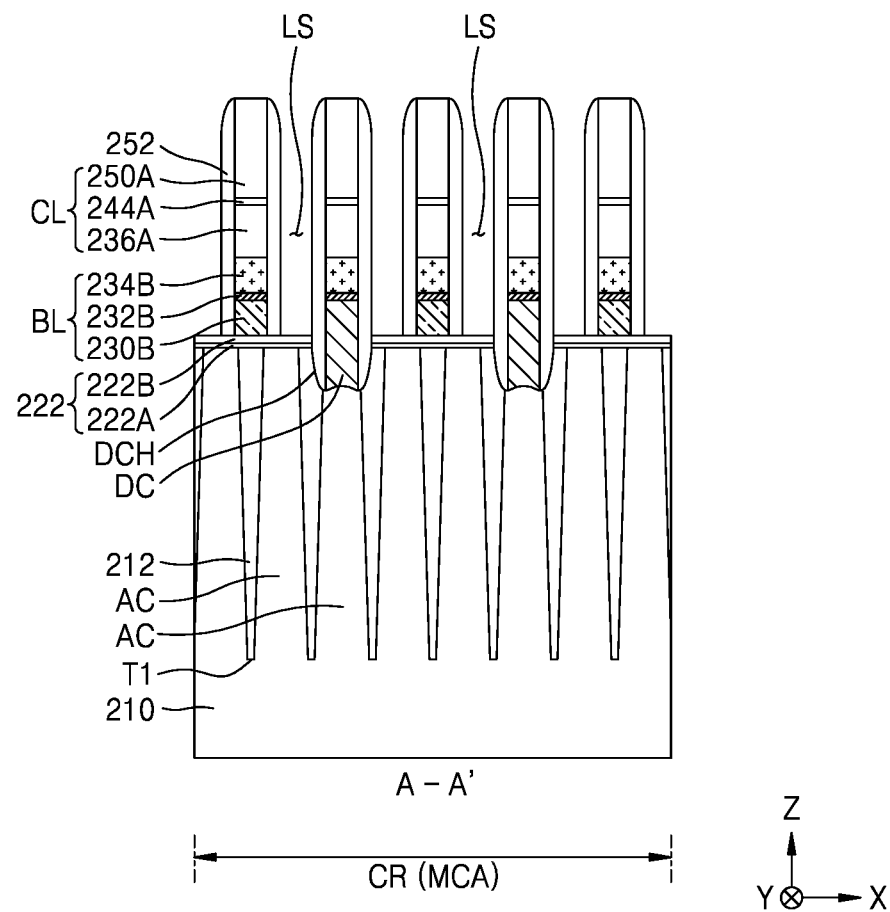

Referring to FIG. 10G, in the resultant material of FIG. 10F, by etching the upper conductive layer 234, the intermediate conductive layer 232, and the lower conductive layer 230 by using the lower insulation capping patterns 236A, the insulating thin film patterns 244A, and the upper insulation capping patterns 250A as etching masks, the plurality of bit lines BL formed of the lower conductive patterns 230B, the intermediate conductive patterns 232B, and the upper conductive patterns 234B are formed and the plurality of insulating spacers 252 are formed. The plurality of insulating spacers 252 may fill the plurality of direct contact holes DCH around the plurality of direct contacts DC. After the plurality of insulating spacers 252 are formed, line spaces LS may be left among the plurality of bit lines BL. By etching processes accompanied while the plurality of bit lines BL and the plurality of insulating spacers 252 are formed, heights of the upper insulation capping patterns 250A may be reduced.

Figure 10H:
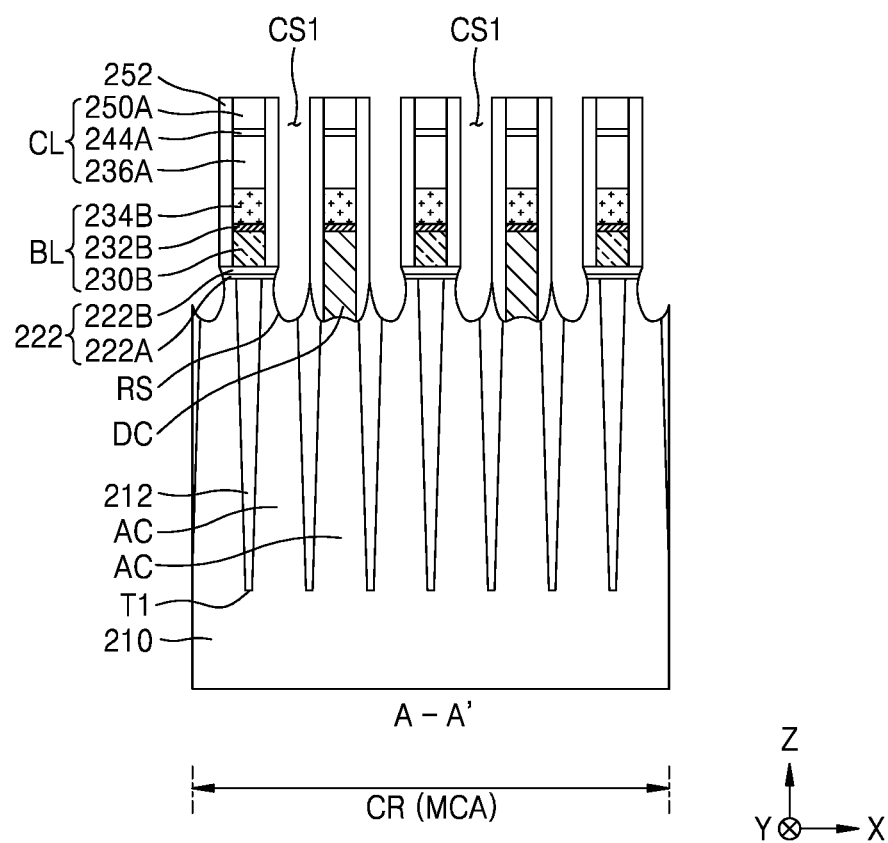

Referring to FIG. 10H, in the cell array region MCA, by forming the plurality of insulating fences 254 (refer to FIG. 8B) between each of the plurality of bit lines BL, one line space LS is divided into a plurality of contact spaces CS1. The plurality of insulating fences 254 (refer to FIG. 8B) may vertically overlap the plurality of word lines 218, respectively. Due to the plurality of insulating fences 254, the one line space LS may be divided into the plurality of contact spaces CS1. At an etching atmosphere accompanied while the plurality of insulating fences 254 are formed, the upper insulation capping patterns 250A and the insulating spacers 252 are exposed so that heights of the upper insulation capping patterns 250A and the insulating spacers 252 may be reduced. Then, by removing parts of structures exposed through the plurality of contact spaces CS1, a plurality of recess spaces RS that expose the plurality of active areas AC are formed among the plurality of bit lines BL.

Figure 10I:
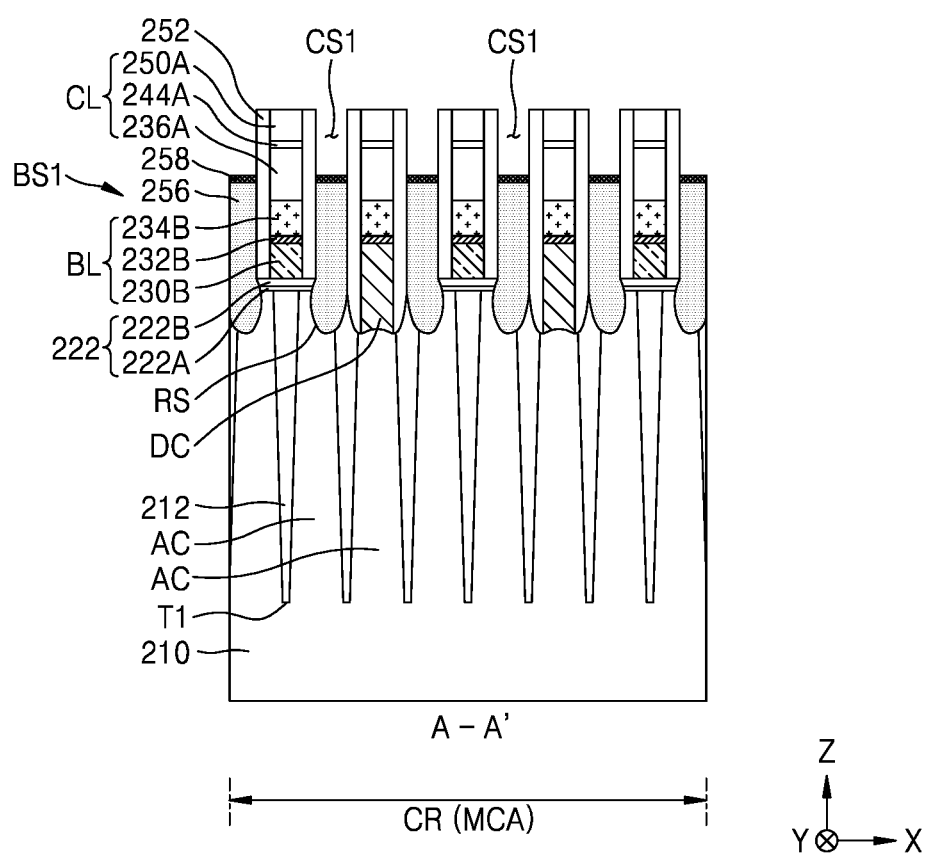

Referring to FIG. 10I, in the cell array region MCA, a plurality of conductive plugs 256 that fill the plurality of recess spaces RS among the plurality of bit lines BL and parts of the plurality of contact spaces CS1 among the plurality of bit lines BL are formed. Then, on the plurality of conductive plugs 256 exposed through the plurality of contact spaces CS1, the plurality of metal silicide layers 258 are formed.

Figure 10J:
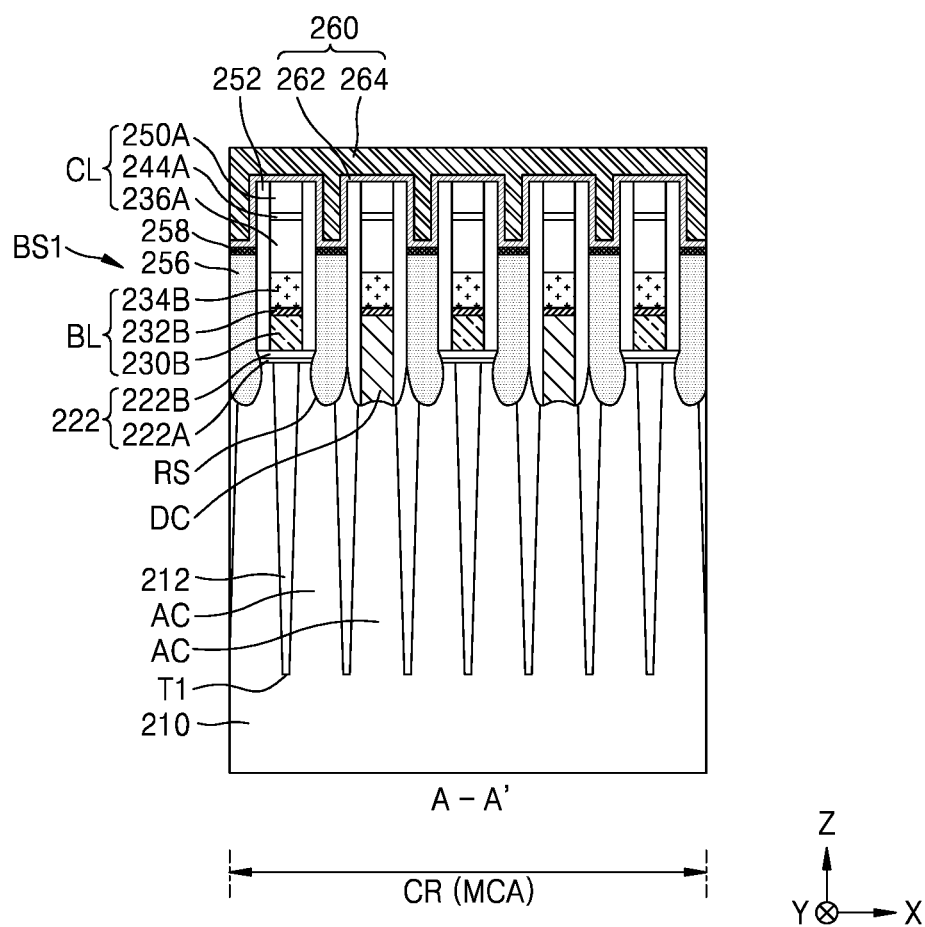

Referring to FIG. 10J, on the resultant material of FIG. 10I, the conductive layer 260 that covers an exposed surface is formed.

Referring to FIG. 9A again, in the cell array region MCA and the scribe lane region SLR, the conductive layer 260 may be simultaneously formed.

The conductive layer 260 may include the conductive barrier layer 262 and the main conductive layer 264. The conductive barrier layer 262 may be formed of Ti, TiN, or a combination of the above metals. The main conductive layer 264 may be formed of metal, a metal nitride, conductive polysilicon, or a combination of the above materials. For example, the main conductive layer 264 may include a tungsten layer.

In the scribe lane region SLR, in the conductive layer 260, as marked with a dashed line in FIG. 9A, the step difference 260ST may be provided. The trench 227 of the second lower structure BS2 and the step difference 260ST of the conductive layer 260 formed thereon may form an alignment key AK2.

In the cell array region MCA, the conductive layer 260 may include a conductive layer upper portion 260H1 that covers the plurality of insulation capping lines CL so as to overlap the plurality of bit lines BL in the vertical direction (the Z direction). In the scribe lane region SLR, the conductive layer 260 that forms the alignment key AK2 may include a high level portion 260H2 that covers an upper surface of the second lower structure BS2 and a low level portion 260L that covers a bottom surface of the trench 227 formed in the second lower structure BS2. The low level portion 260L may extend at almost the same level as that of the upper conductive pattern 234B of the bit line BL in the cell array region MCA along an X-Y plane in a horizontal direction. The high level portion 260H2 may extend at a level higher than that of the upper conductive pattern 234B of the bit line BL in the horizontal direction while covering the upper surface of the second lower structure BS2. The step difference 260ST of the conductive layer 260 may include a portion that extends between the high level portion 260H2 and the low level portion 260L in the vertical direction (the Z direction). In the conductive layer 260, the high level portion 260H2 in the scribe lane region SLR and the conductive layer upper portion 260H1 in the cell array region MCA may extend at almost the same level in the horizontal direction. Here, the term "level" means a height from an upper surface of the substrate 210 in the vertical direction. Each of the upper conductive pattern 234B of the bit line BL and the conductive layer 260 may include a metal layer formed of the same material, for example, a tungsten layer.

After the conductive layer 260 is formed, the conductive layer 260 may fill only a part of the trench 227 formed in the second lower structure BS2 in the scribe lane region SLR. Therefore, after the conductive layer 260 is formed, in the trench 227 left on the conductive layer 260, the step difference 260ST may be exposed.

Figure 9B:
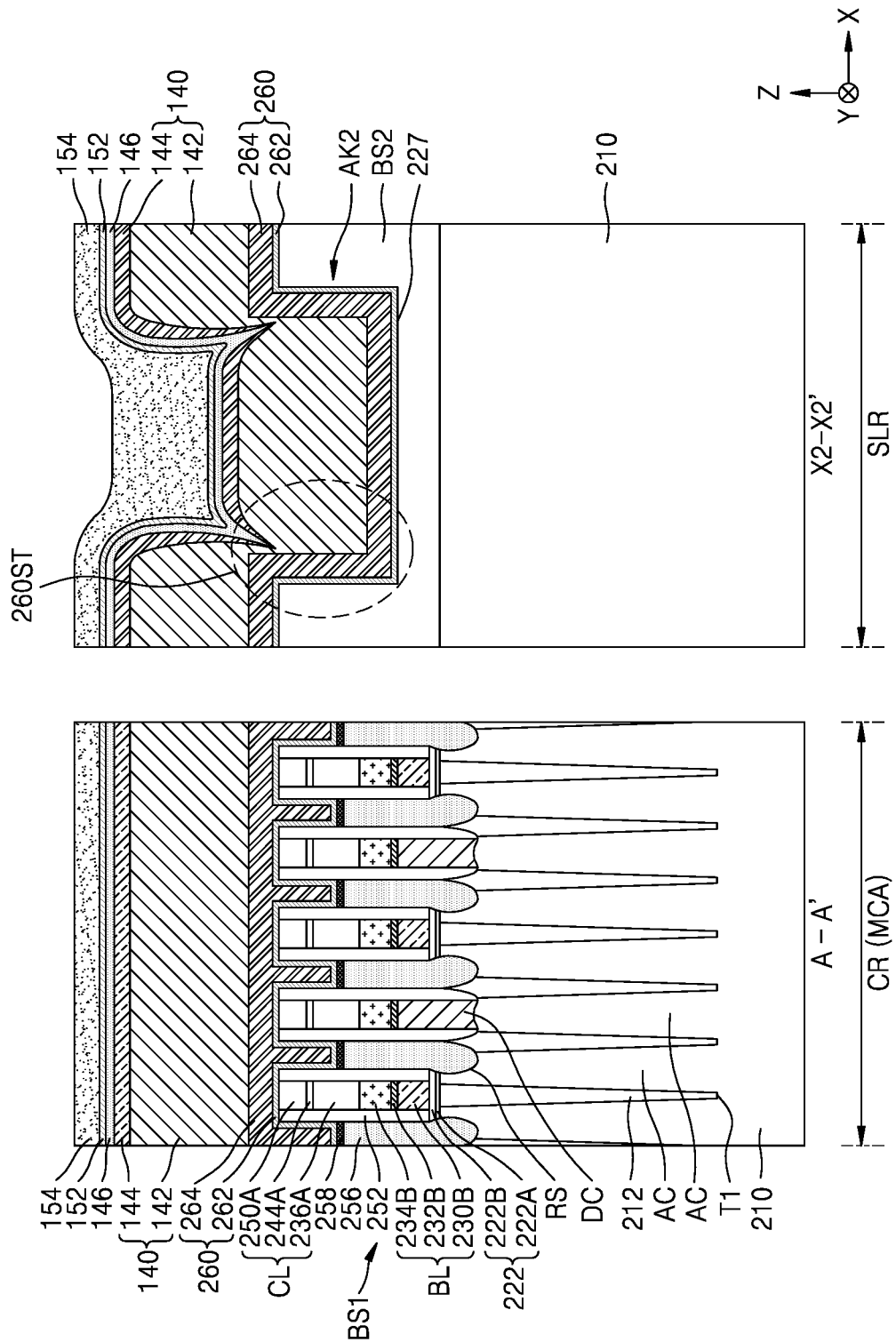

Referring to FIG. 9B, by a method similar to that described with reference to FIGS. 3B to 3E, in the cell array region MCA and the scribe lane region SLR, on the conductive layer 260, the first hard mask layer 142, the second hard mask layer 144, the protective layer 146, the resist underlayer 152, and the photoresist layer 154 are sequentially formed.

The first hard mask layer 142 may have a substantially constant thickness in the cell array region MCA with almost no thickness variation according to a position, and the thickness of the first hard mask layer 142 may not be constant according to a position in the scribe lane region SLR. In particular, on the step difference 260ST of the conducive layer 260 and the periphery thereof, the step coverage of the first hard mask layer 142 deteriorates so that, around the step difference 260ST, a part of the first hard mask layer 142 may have a thickness much smaller than that of the other portion of the first hard mask layer 142.

The second hard mask layer 144 may have a substantially constant thickness in the cell array region MCA with almost no thickness variation according to a position, and the thickness of the second hard mask layer 144 may not be constant according to a position in the scribe lane region SLR. In particular, on the step difference 260ST of the conducive layer 260 and the periphery thereof, the step coverage of the second hard mask layer 144 that covers the first hard mask layer 142 deteriorates so that, around the step difference 260ST, a part of the second hard mask layer 144 may have a thickness much smaller than that of the other portion of the second hard mask layer 144.

The protective layer 146 may have a uniform thickness in the cell array region MCA and the scribe lane region SLR. In the protective layer 146, around the step difference 260ST of the conductive layer 260, a portion that covers the second hard mask layer 144 does not have a thickness smaller than those of the other portions of the protective layer 146. For example, the protective layer 146 may maintain at least an amount of thickness for protecting the hard mask structure 140 while covering the hard mask structure 140 so that the hard mask structure 140 is not exposed to the outside in the cell array region MCA and the scribe lane region SLR. Exemplary configurations of the resist underlayer 152 and the photoresist layer 154 are the same as described with reference to FIG. 3E.

Referring to FIG. 9C, by the same method as described with reference to FIG. 3F, in the cell array region MCA, by exposing and developing the photoresist layer 154, photoresist patterns 154Q are formed from the photoresist layer 154. In the scribe lane region SLR, the photoresist layer 154 may not be exposed and developed.

Plane shapes of the photoresist patterns 154Q may correspond to those of the plurality of conductive landing pads LP illustrated in FIG. 8A. The photoresist patterns 154Q may be formed of a plurality of island patterns PA (refer to FIG. 2A) spaced apart from each other and regularly arranged in the X direction.

In example embodiments, by examining the photoresist pattern 154Q, an alignment state and defects of the photoresist pattern 154Q may be checked. As a result of examining the photoresist pattern 154Q, when it is determined that the photoresist pattern 154Q is defective, in a subsequent etching process, it is difficult to use the photoresist pattern 154Q as an etching mask and it is necessary to perform a rework process for removing the photoresist pattern 154Q and forming a new photoresist pattern. For example, as a result of examining the photoresist pattern 154Q, when a wiggling phenomenon in which the photoresist pattern 154Q is winding, a striation phenomenon in which a surface of the photoresist pattern 154Q is rough, a phenomenon in which the photoresist pattern 154Q falls, or a phenomenon in which an alignment state of the photoresist pattern 154Q deviates from tolerance occurs, it may be determined that the photoresist pattern 154Q is defective.

For the rework process, the photoresist pattern 154Q in the chip region CR and the photoresist layer 154 in the scribe lane region SLR may be exposed to the rework atmosphere 160 (refer to FIG. 4A).

Figure 9D:
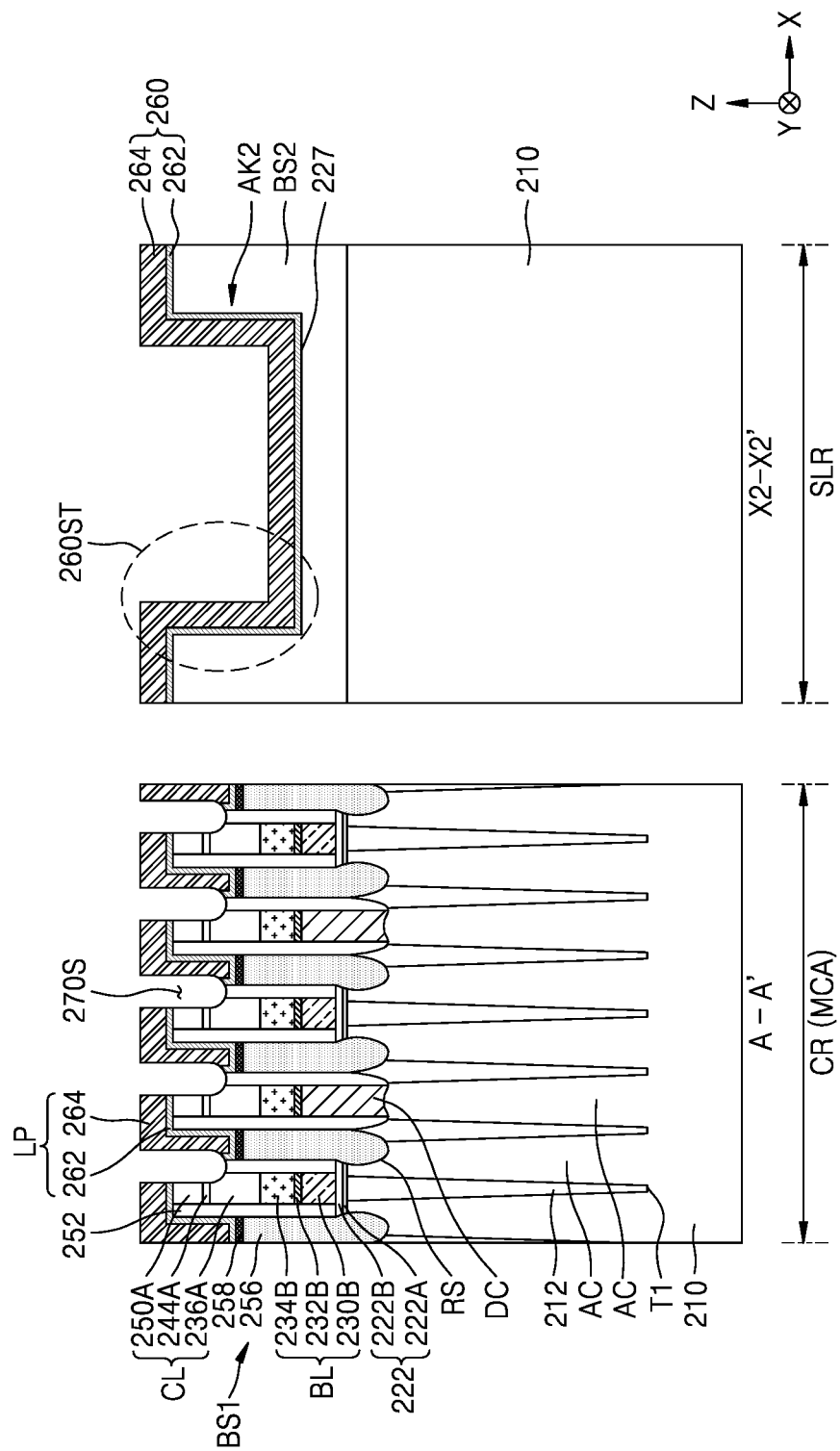

Referring to FIG. 9D, in the resultant material of FIG. 9C, by sequentially and anisotropically etching the resist underlayer 152, the protective layer 146, and the hard mask structure 140 and anisotropically etching the conductive layer 260 in the cell array region MCA by using the photoresist patterns 154Q in the cell array region MCA and the photoresist layer 154 in the scribe lane region SLR as etching masks by the same method as described with reference to FIG. 3G, the plurality of conductive landing pads LP are formed in the cell array region MCA.

Then, by removing unnecessary materials left on the plurality of conductive landing pads LP by a method similar to that described with reference to FIG. 3H, upper surfaces of the plurality of conductive landing pads LP are exposed. In the scribe lane region SLR, an upper surface of the conductive layer 260 that forms the alignment key AK2 may be exposed again.

As illustrated in FIG. 7, in a plane view, the plurality of conductive landing pads LP may be in the form of the plurality of island patterns PA. The plurality of conductive landing pads LP may vertically overlap parts of the plurality of bit lines BL on the plurality of insulation capping lines CL. While an etching process for forming the plurality of conductive landing pads LP is performed in the cell array region MCA, in the cell array region MCA, insulating spaces 270S that expose the plurality of insulating spacers 252 may be formed around the plurality of conductive landing pads LP.

Figure 9E:
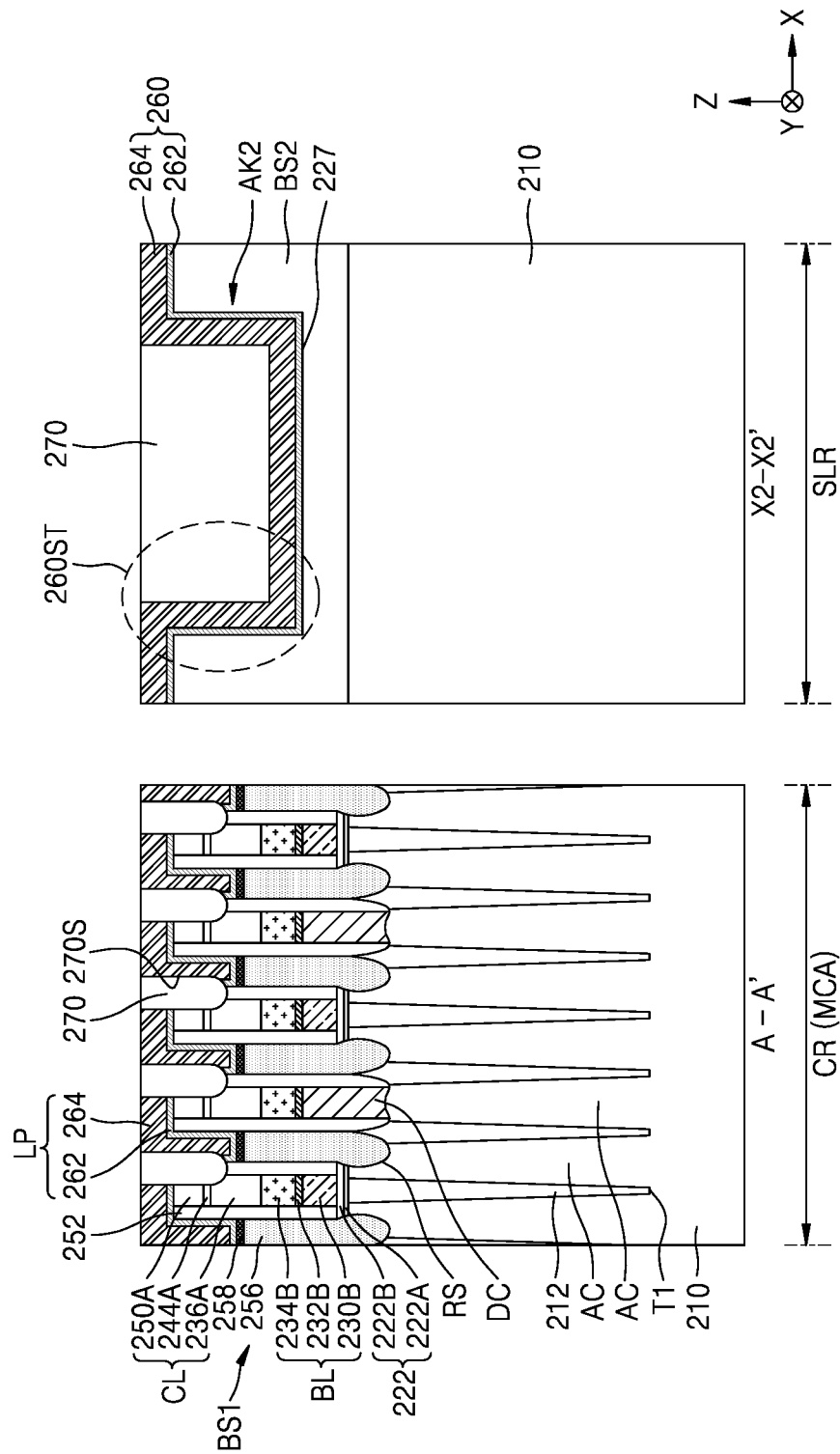

Referring to FIG. 9E, in the resultant material of FIG. 9D, an insulating layer 270 that fills the insulating spaces 270S in the cell array region MCA and the trench 227 left on the conductive layer 260 in the scribe lane region SLR is formed.

In exemplary embodiments, before filling the insulating spaces 270S with the insulating layer 270 in the cell array region MCA, by transforming parts of the plurality of insulating spacers 252 through the insulating spaces 270S, air spacers may be formed in the plurality of insulating spacers 252. After forming the insulating layer 270, in the cell array region MCA, a lower electrode of a capacitor may be formed on a corresponding one of the plurality of conductive landing pads LP. In some examples, the integrated circuit device 200 may include a plurality of capacitor structures (not shown) formed by sequentially forming a plurality of lower electrodes, a capacitor dielectric film, and an upper electrode on the plurality of landing pads LP in the cell array region MCA. The plurality of lower electrodes may be electrically connected to the plurality of landing pads LP, respectively. The capacitor dielectric film may conformally cover the plurality of lower electrodes. The upper electrode may cover the capacitor dielectric film. The upper electrode may face the plurality of lower electrodes with the capacitor dielectric film between the upper electrode and the plurality of lower electrodes. The capacitor dielectric film and the upper electrode may be integrally formed to cover the plurality of lower electrodes in the cell array region MCA.

By an exemplary method of manufacturing the integrated circuit device 200 described with reference to FIGS. 9A to 9E, in order to simultaneously form the plurality of conductive landing pads LP arranged in the cell array region MCA and having large pattern density and the alignment key AK2 arranged in the scribe lane region SLR, when a photolithography process is performed, the protective layer 146 for protecting the hard mask structure 140 is formed on the hard mask structure 140 and the photoresist layer 154 is formed on the protective layer 146. Therefore, after forming the photoresist layer 154, during a rework process for removing the photoresist layer 154 again, since the hard mask structure 140 may be covered with and protected by the protective layer 146 although a partial area of the hard mask structure 140 includes a portion vulnerable to the rework atmosphere due to deteriorated step coverage of the hard mask structure 140 around the step difference 260ST of the conductive layer 260 in the scribe lane region SLR, while the rework process similar to that described with reference to FIGS. 4A to 4C is performed, in the scribe lane region SLR, the conductive layer 260 and the hard mask structure 140 may be prevented from being damaged or transformed. Therefore, when a photolithography process for forming a new photoresist pattern on the protective layer 146 is performed in a subsequent process, precise control may be smoothly performed by using the alignment key AK2 in the scribe lane region SLR. In addition, although the above-described rework process is performed a plurality of times, the hard mask structure 140 is protected by the protective layer 146. Therefore, while the rework process is performed the plurality of times, the conductive layer 260 and the hard mask structure 140 may be prevented from being damaged and transformed. Therefore, in the cell array region MCA, by precisely checking and correcting an alignment state and defects of the photoresist pattern 154P, the plurality of conductive landing pads LP each having a desired shape, size, and alignment state may be formed.

In addition, when the plurality of conductive landing pads LP having large pattern density are formed in the cell array region MCA, embossed patterning may be used. For this purpose, by using a mask structure including the hard mask structure 140 of a multilayer structure and the protective layer 146 for protecting the hard mask structure 140, by performing an exposure process only once, in the cell array region MCA, the plurality of conductive landing pads LP having large pattern density may be formed. For example, when a double patterning process is used for forming the plurality of conductive landing pads LP, due to problems caused by the double patterning process, plane shapes of the plurality of conductive landing pads LP may be non-uniform. However, according to above disclosed embodiments of the inventive concept, unlike in the method using the double patterning process, the plurality of conductive landing pads LP having uniform plane shapes may be obtained. Therefore, undesired dispersion deterioration or process defects may be prevented from occurring in the plurality of conductive landing pads LP, to increase freedom of design, and to maximize a process margin.

While the inventive concept has been particularly shown and described with reference to embodiments thereof, it will be understood that various changes in form and details may be made therein without departing from the spirit and scope of the following claims.

What is claimed is:

1. A method of manufacturing an integrated circuit device including a plurality of memory cells connected to a plurality of bit lines, the method comprising:
    forming a feature layer on a substrate in a first area for forming a plurality of chips and in a second area surrounding the first area, the feature layer having a flat upper surface in the first area and a step difference in the second area;
    forming a hard mask structure including a first hard mask layer and a second hard mask layer sequentially stacked on the feature layer in the first area and the second area;
    forming a protective layer contacting and covering the second hard mask layer so that the hard mask structure is protected and is not exposed in the first area and the second area;
    forming a photoresist layer on the protective layer in the first area and the second area;
    forming a photoresist pattern by:
    exposing and developing the photoresist layer only in the first area from among the first area and the second area by using the step difference in the second area as an alignment key, and
    not exposing and not developing the photoresist layer in the second area;
    etching the protective layer and the hard mask structure only in the first area from among the first area and the second area by using the photoresist pattern in the first area as an etching mask; and
    after performing the etching of the protective layer and the hard mask structure, forming a plurality of landing pads on a plurality of buried contacts in the first area by etching the feature layer on the first area by using the photoresist pattern,
    wherein a thickness of the first hard mask layer is greater than a thickness of the second hard mask layer,
    wherein one of the plurality of landing pads is electrically connected to a corresponding one of the plurality of memory cells through a corresponding one of the plurality of buried contacts, and vertically overlaps the corresponding buried contact and a corresponding one of the plurality of bit lines,
    wherein in the second area, the feature layer comprises a high level portion extending in a horizontal direction at a first vertical level and a low level portion extending in the horizontal direction at a second vertical level lower than the first vertical level, and the step difference comprises portion extending in a vertical direction between the hi di level portion and the low level portion,
    wherein each of the plurality of bit lines includes a conductive layer positioned at the second vertical level, and
    wherein bottom surfaces of the plurality of buried contacts are located third vertical level lower than the second vertical level.

2. The method of claim 1, wherein, in the forming of the hard mask structure, each of the first and second hard mask layers includes a first portion having a non-uniform thickness on the step difference and a periphery of the step difference, and wherein, in the forming of the protective layer, the protective layer covers the hard mask structure so that the first portion is not exposed to the outside.

3. The method of claim 1, wherein the first hard mask layer is an amorphous carbon layer (ACL) and the second hard mask layer is an amorphous silicon layer sequentially stacked on the feature layer, and
wherein the forming of the protective layer comprises forming a silicon containing layer contacting an upper surface of the amorphous silicon layer and including oxygen atom, nitrogen atom, or a combination thereof.

4. The method of claim 1, wherein the forming of the photoresist pattern comprises exposing the photoresist layer by using extreme ultraviolet (EUV) rays.

5. The method of claim 1, wherein the photoresist pattern includes a plurality of island patterns spaced apart from each other and regularly arranged in a first direction or a second direction perpendicular to the first direction.

6. The method of claim 1,
wherein the plurality of landing, pals include a plurality of island patterns spaced apart from each other and regularly arranged in a first direction.

7. The method of claim 1, wherein the forming of the hard mask structure is performed by a chemical vapor deposition (CVD) process, and
wherein the forming of the protective layer is performed by an atomic layer deposition (ALD) process.

8. The method of claim 1, further comprising:
examining the photoresist pattern after the forming of the photoresist pattern and before the etching of the hard mask structure; and
performing a rework process when it is determined that the photoresist pattern is defective in the examining of the photoresist pattern,
wherein the performing of the rework process comprises:
exposing the protective layer by removing the photoresist pattern in the first area and the second area;
forming a new photoresist layer on the protective layer in the first area and the second area; and
forming a new photoresist pattern by exposing and developing the new photoresist layer in the first area by using the step difference in the second area as an alignment key.

9. The method of claim 8, wherein the exposing the protective layer comprises:
removing the photoresist pattern by an ashing process at an oxygen containing atmosphere in a state in which the protective layer covers the hard mask structure.

10. The method of claim 1, further comprising:
after the forming of the photoresist pattern and before the etching of the protective layer and the hard mask structure, examining the photoresist pattern; and
when it is determined that the photoresist pattern is defective in the examining of the photoresist pattern, removing the photoresist pattern at an oxygen containing atmosphere in a state in which the protective layer covers the hard mask structure and performing the forming of the photoresist layer and the forming of the photoresist pattern again.

11. A method of manufacturing an integrated circuit device including a plurality of memory cells connected to a plurality of bit lines, the method comprising:
on a substrate, forming a first lower structure covering the substrate in a cell array region and a second lower structure covering the substrate in a scribe lane region;
forming a conductive layer covering the first lower structure and the second lower structure and having a step difference in the scribe lane region;
forming a hard mask structure on the conductive layer in the cell array region and the scribe lane region, the hard mask structure including a plurality of hard mask layers;
forming a protective layer covering the hard mask structure so that the hard mask structure is not exposed in the cell array region and the scribe lane region;
forming a photoresist layer on the protective layer in the cell array region and the scribe lane region;
forming a photoresist pattern by:
exposing and developing the photoresist layer only in the cell array region from among the cell array region and the scribe lane region by using the step difference in the scribe lane region as an alignment key, and
not exposing and not developing the photoresist layer in the scribe lane region;
etching the protective layer and the hard mask structure only in the cell array region from among the cell array region and the scribe lane region by using the photoresist pattern in the cell array region as an etching mask; and
after performing the etching of the protective layer and the hard mask structure, forming a plurality of landing pads including a plurality of island patterns spaced apart from each other and regularly arranged in a first direction by etching the conductive layer in the cell array region by using a hard mask structure pattern obtained by etching the hard mask structure as an etching mask,
wherein the plurality of hard mask layers include an amorphous carbon layer (ACL) having a lower surface contacting an upper surface of the conductive layer and an amorphous silicon layer having a lower surface contacting an upper surface of the ACL,
wherein the forming of the protective layer is formed by contacting an upper surface of the amorphous silicon layer,
wherein a thickness of the ACL is greater than a thickness of the amorphous silicon layer,
wherein one of the plurality of landing pads is electrically connected to a corresponding one of the plurality of memory cells through a buried contact, and vertically overlaps the buried contact and a corresponding one of the plurality of bit lines,
wherein, in the scribe lane region, the conductive layer comprises a high level portion covering an upper sur ace of the second lower structure at a first vertical level and a low level portion extending in a horizontal direction at a second vertical level lower than the first vertical level, and the step difference comprises a portion extending in a vertical direction between the high level portion and the low level portion,
wherein each of plurality of bit lines includes a conductive layer positioned at the second vertical level, and
wherein a bottom surface of the buried contact is located at a third vertical level lower than the second vertical level.

12. The method of claim 11, wherein the forming of the photoresist pattern comprises exposing the photoresist layer by using extreme ultraviolet (EUV) rays.

13. The method of claim 11, wherein the conductive layer includes a tungsten layer, and
wherein the protective layer includes a silicon containing layer having a lower surface contacting an upper surface of the amorphous silicon layer and the silicon containing layer includes oxygen atom, nitrogen atom, or a combination thereof.

14. The method of claim 11, wherein the forming of the hard mask structure is performed by a chemical vapor deposition (CVD) process,
wherein the forming of the protective layer is performed by an atomic layer deposition (ALD) process, and
wherein the protective layer includes a silicon oxide layer, a silicon nitride layer, a silicon oxynitride layer, or a combination of the above layers.

15. The method of claim 11, wherein the forming of the hard mask structure comprises forming a first hard mask layer formed of an amorphous carbon layer (ACL) by using a chemical vapor deposition (CVD) process and forming a second hard mask layer including an amorphous silicon layer covering the ACL by using the CVD process,
wherein the forming of the protective layer comprises forming a silicon containing layer including oxygen atom, nitrogen atom, or a combination thereof on the second hard mask layer by using an atomic layer deposition (ALD) process, and
wherein a thickness of the protective layer is less than that of the second hard mask layer.

16. The method of claim 11, further comprising:
after the forming of the photoresist pattern and before the etching of the protective layer and the hard mask structure, examining the photoresist pattern; and
in the examining of the photoresist pattern, when it is determined that the photoresist pattern is defective, removing the photoresist pattern at an oxygen containing atmosphere in a state in which the protective layer covers the hard mask structure, and performing the forming of the photoresist layer again.

17. A method of manufacturing an integrated circuit device including a plurality of memory connected to a plurality of bit lines, the method comprising:
forming a first lower structure including a plurality of bit lines each including a metal layer on a substrate in a cell array region and a second lower structure including a trench in an upper surface of the second lower structure on the substrate in a scribe lane region;
forming a conductive layer covering the first lower structure and the second lower structure and having a step difference around the trench in the scribe lane region;
forming a hard mask structure including an amorphous carbon layer (ACL) contacting the conductive layer and an amorphous silicon layer contacting the ACL in the cell array region and the scribe lane region, the ACL and the amorphous silicon layer sequentially stacked on the conductive layer;
forming a protective layer contacting and covering the amorphous silicon layer of the hard mask structure so that the amorphous silicon layer is not exposed in the cell array region and the scribe lane region;
forming a photoresist layer on the protective layer in the cell array region and the scribe lane region;
forming a photoresist pattern by:
exposing and developing the photoresist layer only in the cell array region from among the cell array region and the scribe lane region by using the step difference in the scribe lane region as an alignment key, and
not exposing and not developing the photoresist layer in the scribe lane region;
examining the photoresist pattern;
when it is determined that the photoresist pattern is defective in the examining of the photoresist pattern, removing the photoresist pattern at an oxygen containing atmosphere in a state in which the protective layer covers the hard mask structure and performing the forming of the photoresist layer and the forming of the photoresist pattern again; and
forming a plurality of landing pads including a plurality of island patterns spaced apart from each other and regularly arranged from the conductive layer by transcribing a shape of the photoresist pattern onto the conductive layer only in the cell array region from among the cell array region and the scribe lane region,
wherein one of the plurality of landing pads is electrically connected to a corresponding one of the plurality of memory cells through a buried contact, and vertically overlaps the buried contact and a corresponding one of the plurality of bit lines,
wherein, in the scribe lane region, the conductive layer comprises a high level portion covering an upper surface of the second lower structure at a first vertical level and a low level portion extending in a horizontal direction a ta second vertical level lower than the first vertical level, and the step difference comprises a portion extending in a vertical direction between the high level portion and the low level portion,
wherein each of the plurality of bit lines includes a conductive layer positioned at the second vertical level, and
wherein a bottom surface of the buried contact is located at a third vertical level lower than the second vertical level.

18. The method of claim 17, wherein the forming of the photoresist pattern comprises exposing the photoresist layer by using extreme ultraviolet (EUV) rays, and
wherein the forming of the protective layer comprises forming a silicon oxide layer, a silicon nitride layer, or a silicon oxynitride layer by using an atomic layer deposition (ALD) process.

* * * * *